US012805191B2

(12) United States Patent
Song et al.

(10) Patent No.: US 12,805,191 B2
(45) Date of Patent: Nov. 17, 2026

(54) LIGHT EMITTING DEVICE AND LIGHT EMITTING DISPLAY DEVICE INCLUDING THE SAME

(71) Applicant: LG Display Co., Ltd., Seoul (KR)

(72) Inventors: Wook Song, Paju-si (KR); Ji Cheol Shin, Paju-si (KR); Sae Mi Park, Paju-si (KR); Myeong Seon Cho, Paju-si (KR); Hui Kun Yun, Paju-si (KR); Jung Keun Kim, Paju-si (KR); Byung Soo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 908 days.

(21) Appl. No.: 18/088,430

(22) Filed: Dec. 23, 2022

(65) Prior Publication Data

US 2023/0217822 A1 Jul. 6, 2023

(30) Foreign Application Priority Data

Dec. 31, 2021 (KR) ........................ 10-2021-0194812

(51) Int. Cl.

*H10K 85/60* (2023.01)
*H10K 50/19* (2023.01)
*H10K 85/30* (2023.01)
*H10K 50/80* (2023.01)
*H10K 59/12* (2023.01)

(52) U.S. Cl.

CPC ......... *H10K 85/6572* (2023.02); *H10K 50/19* (2023.02); *H10K 85/342* (2023.02); *H10K 85/626* (2023.02); *H10K 85/631* (2023.02); *H10K 85/636* (2023.02); *H10K 85/658* (2023.02); *H10K 50/80* (2023.02); *H10K 59/12* (2023.02)

(58) Field of Classification Search

None

See application file for complete search history.

(56) References Cited

U.S. PATENT DOCUMENTS

| | | | | |
|---|---|---|---|---|
| 2011/0133226 | A1 | 6/2011 | Lee et al. | |
| 2017/0162792 | A1* | 6/2017 | Kim | C07C 255/47 |
| 2018/0166647 | A1 | 6/2018 | Shin et al. | |
| 2019/0326372 | A1* | 10/2019 | Han | H10K 50/19 |
| 2020/0106025 | A1 | 4/2020 | Shin et al. | |
| 2020/0131133 | A1* | 4/2020 | La | H10K 85/622 |
| 2020/0144552 | A1* | 5/2020 | Kim | H10K 85/631 |
| 2021/0202859 | A1 | 7/2021 | Shin et al. | |
| 2022/0194883 | A1* | 6/2022 | Shin | C07C 255/51 |
| 2022/0199909 | A1* | 6/2022 | Shin | H10K 85/60 |
| 2023/0064765 | A1* | 3/2023 | Lee | H10K 50/826 |
| 2023/0292595 | A1* | 9/2023 | Werner | H10K 85/615 |

FOREIGN PATENT DOCUMENTS

| | | | |
|---|---|---|---|
| CN | 102097456 | A | 6/2011 |
| KR | 10-2020-0037654 | A | 4/2020 |
| KR | 102107199 | B1 | 5/2020 |
| KR | 10-2021-0086209 | A | 7/2021 |
| KR | 10-2867301 | B1 | 10/2025 |

OTHER PUBLICATIONS

Korean Intellectual Property Office, Office Action, KR Patent Application No. 10-2021-0194812, Dec. 12, 2024, 14 pages.

* cited by examiner

*Primary Examiner* — Robert S Loewe
(74) *Attorney, Agent, or Firm* — Fenwick & West LLP

(57) ABSTRACT

Disclosed is a light emitting device that is capable of reducing lateral leakage current and a driving voltage by improving a structure for connecting a plurality of stacks to one another in a structure using the plurality of stacks, and a light emitting display device including the same. The light emitting device includes a first electrode and a second electrode facing each other, a plurality of stacks provided between the first electrode and the second electrode, and a charge generation layer including an electron generation layer and a hole generation layer stacked between the stacks, wherein the electron generation layer contains a first host of Formula 1 and a metal dopant, and the hole generation layer contains a second host and an organic dopant.

18 Claims, 4 Drawing Sheets

LIGHT EMITTING DEVICE AND LIGHT EMITTING DISPLAY DEVICE INCLUDING THE SAME

CROSS-REFERENCE TO RELATED APPLICATIONS

This application claims the benefit of Republic of Korea Patent Application No. 10-2021-0194812, filed on Dec. 31, 2021, which is hereby incorporated by reference as if fully set forth herein.

BACKGROUND

Field

The present disclosure relates to a light emitting device, and more particularly to a light emitting device that is capable of reducing a lateral leakage current and a driving voltage by improving a structure of connecting a plurality of stacks to one another in a structure using the plurality of stacks, and a light emitting display device including the same.

Discussion of the Related Art

Recently, a light emitting display device that does not require a separate light source and has a light emitting device in a display panel without a separate light source to make the display device compact and realize clear color has been considered a competitive application.

Meanwhile, the light emitting device currently used in light emitting displays requires higher efficiency in order to realize a desired image quality, and is preferably implemented in the form of a plurality of stacks.

The use of multiple stacks leads to the formation of the light emitting layer in each stack, thus requiring a connection structure between the stacks to supply carriers to stacks far away from the electrode. There is a problem in that when the light emission principle of two adjacent stacks is different, it is difficult to supply holes and electrons in equal amounts from the connection structure to the two adjacent stacks. In addition, when an imbalance of carriers between holes and electrons supplied from the connection structure to the two adjacent stacks occurs, a problem of increased driving voltage also occurs.

SUMMARY

Accordingly, the present disclosure is directed to a light emitting device and a light emitting display device including the same that substantially obviate one or more problems due to the limitations and disadvantages of the related art.

It is an object of the present disclosure to provide a light emitting device that is capable of preventing a lateral leakage current and reducing a driving voltage by changing the structure for connecting a plurality of stacks to one another in a structure having the plurality of stacks between two electrodes, and a light emitting display device including the same.

Additional advantages, objects, and features of the invention will be set forth in part in the description which follows and in part will become apparent to those having ordinary skill in the art upon examination of the following, or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a light emitting device includes a first electrode and a second electrode, a plurality of stacks between the first electrode and the second electrode, and a charge generation layer between two stacks, the charge generation layer including an electron generation layer and a hole generation layer, wherein the electron generation layer contains a first host of Formula 1 and a metal dopant, and the hole generation layer contains a second host and an organic dopant.

In another aspect of the present disclosure, a light emitting device includes a first electrode and a second electrode, a blue stack disposed adjacent to the first electrode, the blue stack including a first hole transport layer, a blue light emitting layer and a first electron transport layer, a phosphorescent stack disposed adjacent to the second electrode, the phosphorescent stack including a second hole transport layer, a phosphorescent light emitting portion including at least two light emitting layers configured to emit light with wavelengths longer than blue light, which are connected to one another, and a second electron transport layer, wherein the electron generation layer includes a first host of Formula 1, and the hole generation layer contains an organic dopant of Formula 2.

In another aspect of the present disclosure, a light emitting display device includes a substrate including a plurality of subpixels, a thin film transistor at each of the subpixels on the substrate, and the light emitting device connected to the thin film transistor.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the disclosure.

DETAILED DESCRIPTION

Figure 1:
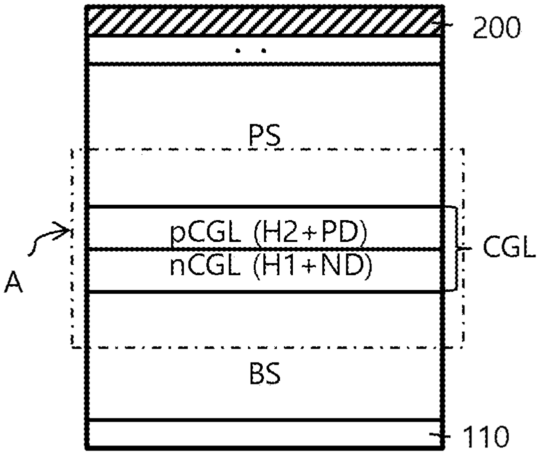
FIG. 1 is a cross-sectional view schematically illustrating a light emitting device according to an embodiment of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clear description of the specification, and may differ from the names of elements of actual products.

The shape, size, ratio, angle, number, and the like shown in the drawings to illustrate various embodiments of the present invention are merely provided for illustration, and are not limited to the content shown in the drawings. Wherever possible, the same reference numbers will be used throughout the drawings to refer to the same or like parts. In the following description, detailed descriptions of technologies or configurations related to the present disclosure may be omitted so as to avoid unnecessarily obscuring the subject matter of the present invention. When terms such as “including”, “having”, and “comprising” are used throughout the specification, an additional component may be present, unless “only” is used. A component described in a singular form encompasses a plurality thereof unless particularly stated otherwise.

The components included in the embodiments of the present disclosure should be interpreted to include an error range, even if there is no additional particular description thereof.

In describing a variety of embodiments of the present invention, when terms for positional relationships such as “on”, “above”, “under” and “next to” are used, at least one intervening element may be present between two elements, unless “immediately” or “directly” is used.

In describing a variety of embodiments of the present invention, when terms related to temporal relationships, such as “after”, “subsequently”, “next” and “before”, are used, the non-continuous case may be included, unless “immediately” or “directly” is used.

In describing a variety of embodiments of the present invention, terms such as “first” and “second” may be used to describe a variety of components, but these terms only aim to distinguish the same or similar components from one another. Accordingly, throughout the specification, a “first” component may be the same as a “second” component within the technical concept of the present disclosure, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

As used herein, the term “doped” means that, in a material that occupies most of the weight ratio of a layer, a material (for example, N-type and P-type materials, or organic and inorganic substances) having physical properties different from the material that occupies most of the weight ratio of the layer is added in an amount of less than 30% by weight. In other words, the “doped” layer refers to a layer that is used to distinguish a host material from a dopant material of a certain layer, in consideration of the specific gravity of the weight ratio. Also, the term “undoped” refers to any case other than a “doped” case. For example, when a layer contains a single material or a mixture of materials having the same properties as each other, the layer is included in the “undoped” layer. For example, if at least one of the materials constituting a certain layer is p-type and not all materials constituting the layer are n-type, the layer is included in the “undoped” layer. For example, if at least one of materials constituting a layer is an organic material and not all materials constituting the layer are inorganic materials, the layer is included in the “undoped” layer. For example, when all materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered a “doped” layer.

Hereinafter, a light emitting device of the present disclosure and a light emitting display device including the same will be described with reference to the drawings.

Figure 2:
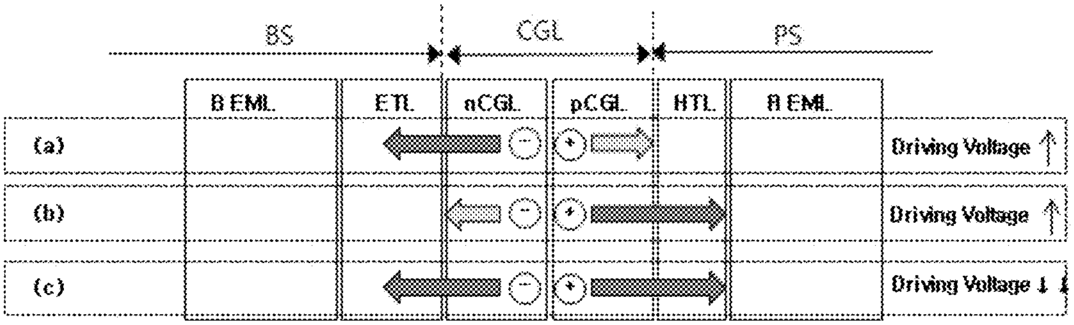
FIG. 2 is a diagram illustrating the relationship between a driving voltage, and generation and transfer of electrons and holes in an electron generation layer and a hole generation layer, respectively, in region A of FIG. 1 according to an embodiment of the present disclosure.

FIG. 1 is a cross-sectional view schematically illustrating a light emitting device according to an embodiment of the present disclosure. FIG. 2 is a diagram illustrating the relationship between a driving voltage, and generation and transfer of electrons and holes in an electron generation layer and a hole generation layer, respectively, in region A of FIG. 1 according to an embodiment of the present disclosure.

As shown in FIG. 1, the light emitting device according to an embodiment of the present disclosure includes a first electrode 110 and a second electrode 200 facing each other, a blue stack BS and a phosphorescent stack PS disposed between the first electrode 110 and the second electrode 200, and a charge generation layer CGL between the blue stack BS and the phosphorescent stack PS.

The first electrode 110 may be referred to as an anode because it supplies holes, and the second electrode 200 may be referred to as a cathode because it supplies electrons. In some cases, contrary to the drawings, the first electrode 110 disposed in a lower region may be a cathode, and the second electrode 200 may be an anode.

Here, under the assumption that holes are supplied from the first electrode 110 and electrons are supplied from the second electrode 200, the blue stack BS may lack electrons and the phosphorescent stack PS may lack holes. That is, in a structure having a plurality of stacks, a charge generation layer CGL is provided inside the first and second electrodes 110 and 200 to supply charges, i.e., electrons or holes, to insufficiently charged stacks far away from the electrode.

The charge generation layer CGL may include an electron generation layer nCGL and a hole generation layer pCGL, each of which generates electrons and transfers the electrons to the blue stack BS, and the generation layer pCGL generates holes and transfers the holes to the phosphorescent stack PS.

The configuration shown in FIG. 1 is provided as an example, and a configuration in which the phosphorescent stack PS is disposed under the charge generation layer CGL and the blue stack BS is disposed thereon is also possible.

Also, in addition to the illustrated blue stack BS and phosphorescent stack PS, another stack is further provided between the phosphorescent stack PS and the second electrode 200, and another charge generation layer is provided between the other stack and the phosphorescent stack PS.

Meanwhile, each of the blue stack BS and the phosphorescent stack PS may include a hole transport layer, a light emitting layer and an electron transport layer.

Accordingly, as shown in FIG. 2, the electron generation layer nCGL may be in contact with the electron transport layer ETL of the adjacent blue stack BS, and the hole generation layer pCGL may be in contact with the hole transport layer HTL of the adjacent phosphorescent stack PS. In this case, the opposite surface of the electron transport layer ETL of the blue stack BS that is not in contact with the electron generation layer nCGL may be in contact with the blue light emitting layer B EML, and the opposite surface of the hole transport layer HTL of the phosphorescent stack PS that is not in contact with the hole generation layer pCGL may be in contact with the red light emitting layer R EML.

Meanwhile, the electron generation layer nCGL includes a first host H1 and an n-type dopant ND. Here, the n-type dopant ND interacts with the first host H1 in the electron generation layer nCGL to generate electrons, and contains a transition metal such as ytterbium (Yb) or an alkali metal or alkaline earth metal such as lithium (Li) or magnesium (Mg).

The electron generation layer nCGL may be in contact with an electron transport layer ETL containing a compound having anthracene as a core of an adjacent stack BS. However, the electron transport layer ETL in contact with the electron generation layer nCGL is not necessarily a compound having an anthracene core, but may be a compound that is modified to improve efficiency in the stack BS. For example, the material for the electron transport layer ETL may be a nitrogen-containing compound including a material such as a cycloalkyl group, an aryl group, a heteroaryl group, and a carbazole group.

The hole generation layer pCGL contains a second host H2 and an organic dopant PD. Compared to the electron generation layer nCGL, the hole generation layer pCGL contains a dopant and an organic material, and an energy band gap difference therebetween promotes hole generation and transport. That is, in the hole generation layer pCGL, the LUMO level of the organic dopant PD is similar to the HOMO level of the second host H2, and the organic dopant PD acts to transfer holes generated at the HOMO level of the second host H2 to the hole transport layer HTL of the adjacent phosphorescent stack PS.

The second host H2 contained in the hole generation layer pCGL may be an amine compound different from the hole transport layer HTL of the adjacent stack PS.

For example, the hole transport layer HTL used in the adjacent stack PS may be formed of a biscarbazole-based compound. In this case, the second host H2 contained in the hole generation layer pCGL may be an amine-based compound, for example, BPBPA, DNTPD, NPB, m-MTDATA, or the like. However, the second host H2 is not necessarily an amine-based compound, and may be any compound, as long as it can interact with the organic dopant PD to generate holes.

The relationship between the carrier transport of holes and electrons by the charge generation layer CGL and the driving voltage when the blue stack BS and the phosphorescent stack PS are adjacent to each other will be determined with reference to FIG. 2.

An electron generation layer nCGL and a hole generation layer pCGL are provided between the adjacent blue stack BS and phosphorescent stack PS to supply and transfer generated electrons to the blue fluorescent stack BS and to supply and transfer the generated holes to the phosphorescent stack PS.

FIG. 2 shows that the adjacent blue stack BS and the phosphorescent stack PS excluding the charge generation layer CGL have the same structure and characteristics.

(a) in FIG. 2 is an example in which the electron generation layer nCGL has excellent electron generation and transport ability and the hole generation layer pCGL has poor hole generation ability. Although the electrons generated by the electron generation layer nCGL can be transferred to the BEML and then eliminated, a large driving voltage is required in order to transfer the holes generated by the hole generation layer pCGL to the red light emitting layer REML. In addition, a difference in electron and hole transport capability occurs between adjacent stacks, so electrons first supplied from each light emitting layer block holes to prevent the excitation action or vice versa, resulting in decreased recombination of electrons and holes in the light emitting layer.

(b) in FIG. 2, in contrast to (a), is an example in which the electron generation layer nCGL has poor electron generation and transport capability and the hole generation layer pCGL has excellent hole generation and transport capability. The holes generated by the hole generation layer pCGL can be rapidly supplied to the red light emitting layer (REML) through the hole transport layer (HTL) of the phosphorescent stack (PS), but electrons are slowly transferred from the electron generation layer nCGL to the blue light emitting layer (BEML) through the electron transport layer ETL, so a large driving voltage is required.

(c) in FIG. 2 shows that the hole generation layer pCGL has excellent hole generation and transport capability, and in response thereto, the electron generation layer nCGL also has electron generation and transport capability, so it is expected that it is possible to use a lower driving voltage.

The light emitting device of the present disclosure utilizes a material represented by the following Formula 1 as a first host H1 capable of improving electron generation and transport capability when a material is limited to a transition metal such as ytterbium (Yb) to control horizontal diffusion when doping the electron generation layer nCGL with a metal dopant.

[Formula 1]

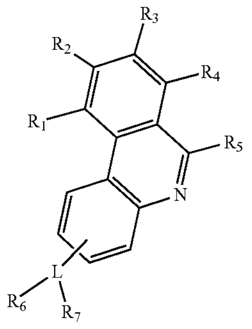

In one embodiment, $R_1$ to $R_6$ are selected from a cycloalkyl group, an aryl group, and a heteroaryl group. In one instance, the aryl group may include a phenyl group, a naphthalene group, a monocyclic or multicyclic aryl group.

In one instance, $R_1$ may be one or more phenyl rings or naphthalene. In one instance, $R_5$ may be one or more phenyl rings or naphthalene. In one instance, R2, R3, and R4 may be hydrogen. In one instance, R6 may be hydrogen or a phenyl ring.

In one embodiment, $R_7$ is triphenylphosphine oxide.

In one embodiment, L is selected from quinazoline and pyrimidine. In one embodiment, there is no linker L.

In addition, a material represented by Formula 1 as the first host H1 of the electron generation layer nCGL may include the following materials NCH-01 to NCH-26. Meanwhile, the first host H1 of the present disclosure is not limited to the materials NCH-01 to NCH-26, and any material represented by Formula 1 can exert effects of preventing diffusion of a metal dopant during electron supply between stacks described in the present disclosure and of reducing a driving voltage.
NCH-01
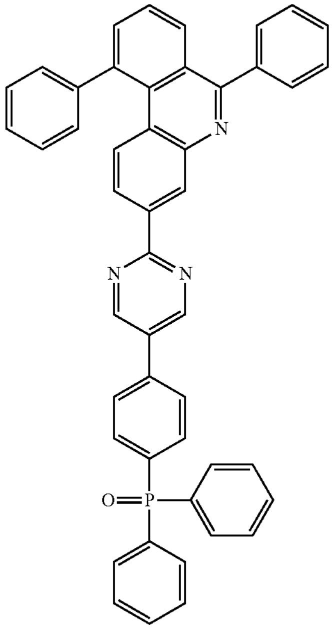
NCH-02
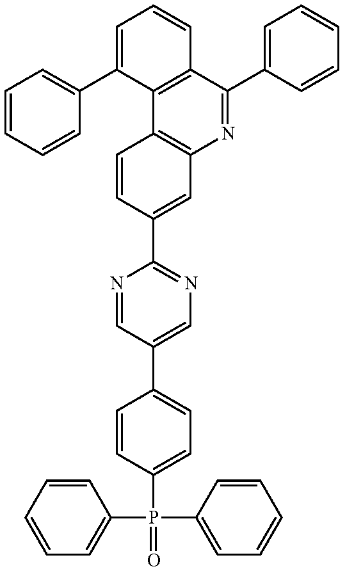
-continued
NCH-03
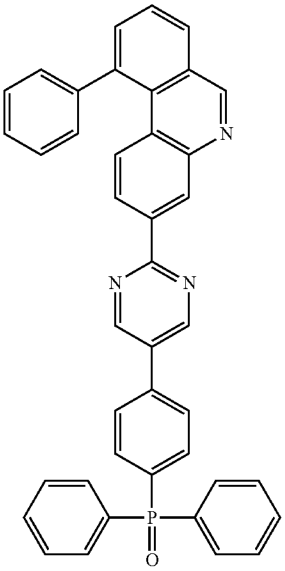
NCH-04
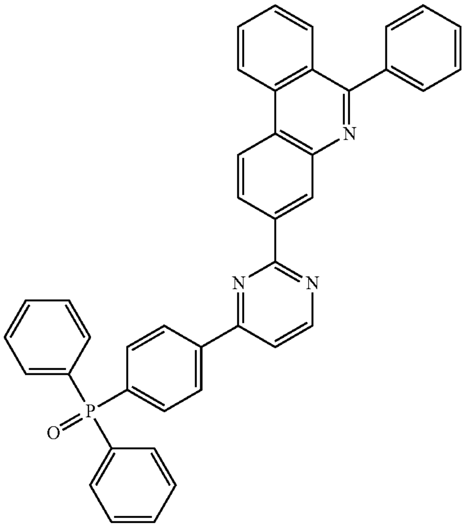
NCH-05
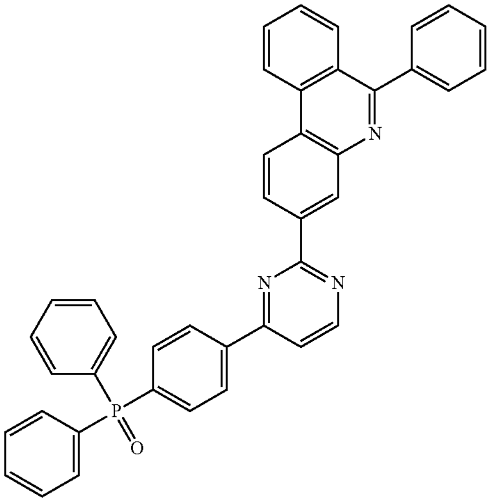

-continued
NCH-06
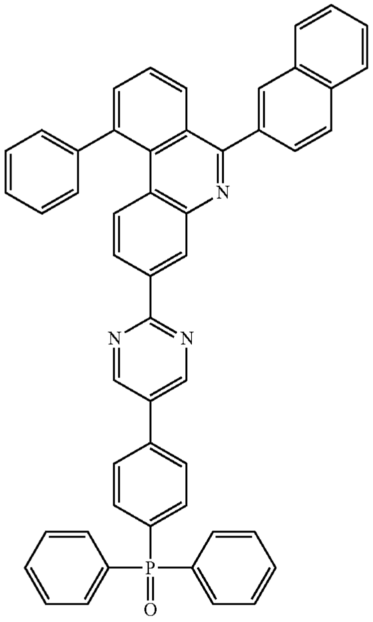
NCH-07
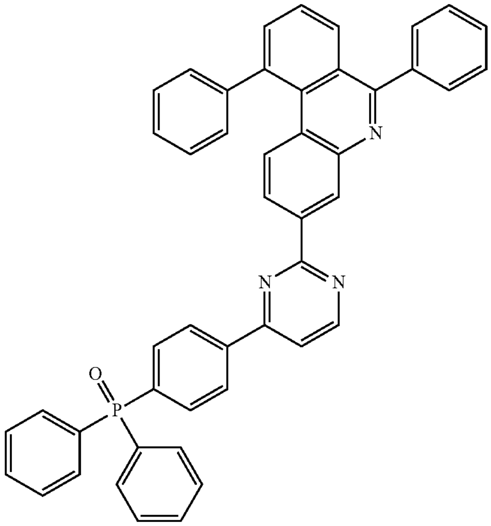
-continued
NCH-08
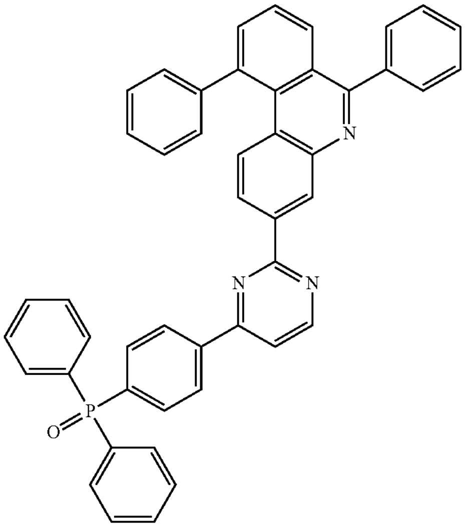
NCH-09
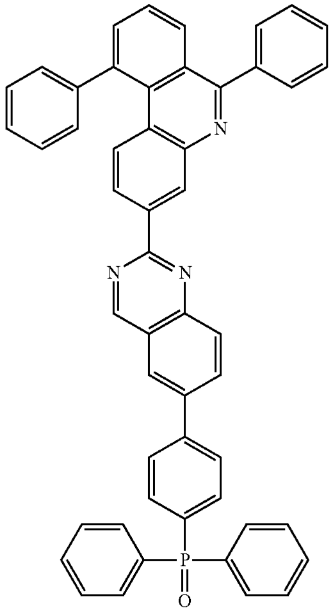

-continued
NCH-10
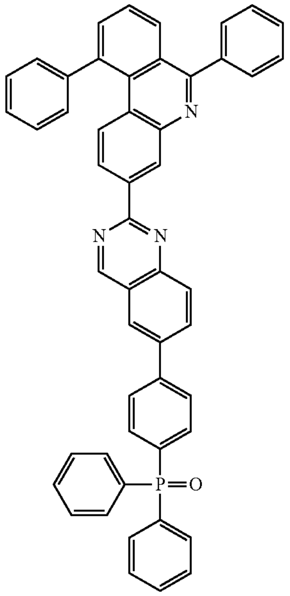
NCH-11
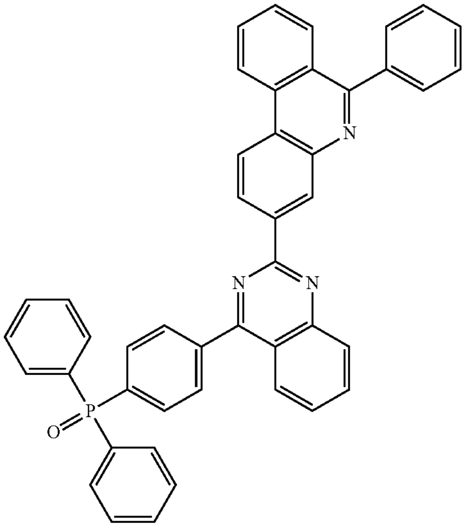
NCH-12
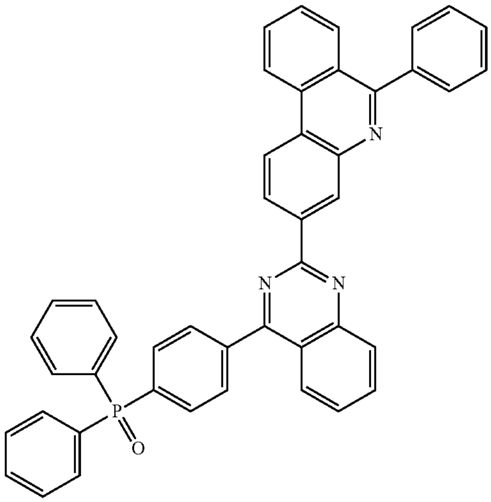
-continued
NCH-13
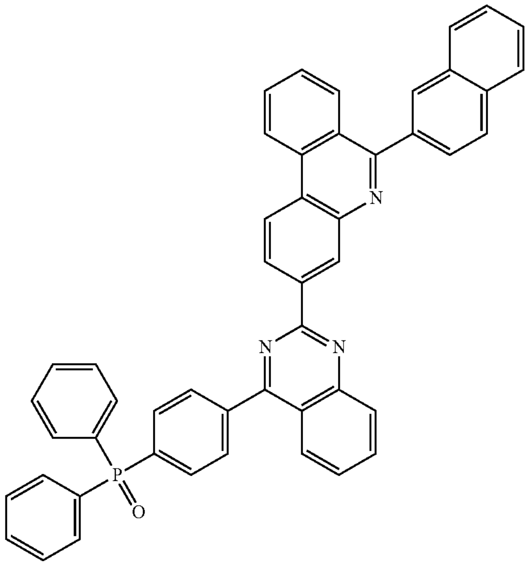
NCH-14
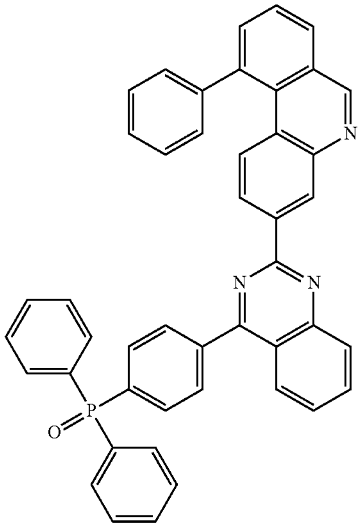
NCH-15
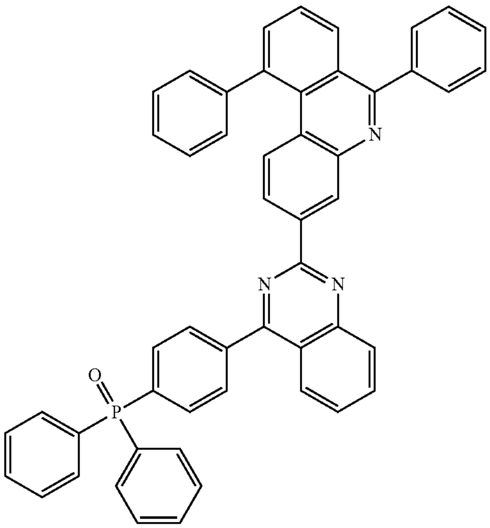

-continued
NCH-16
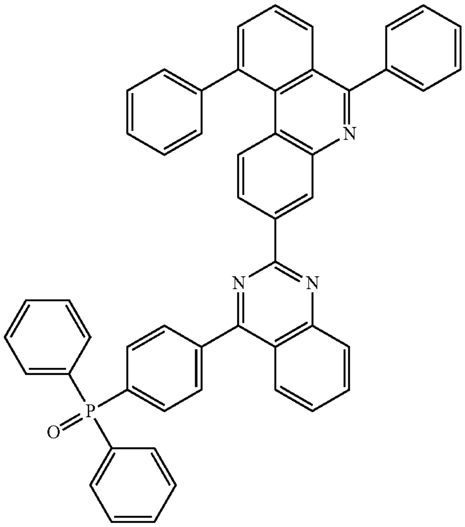
NCH-17
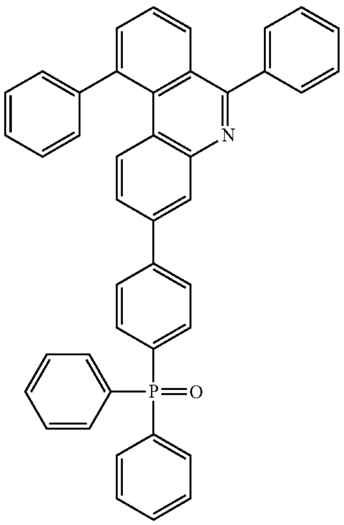
NCH-18
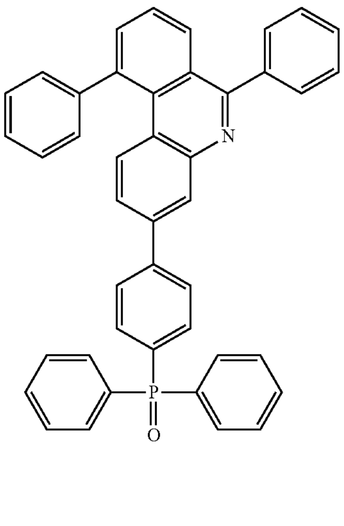
-continued
NCH-19
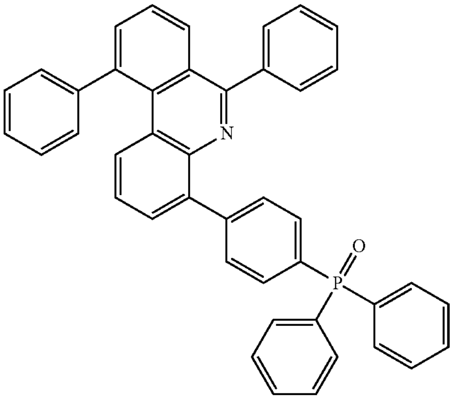
NCH-20
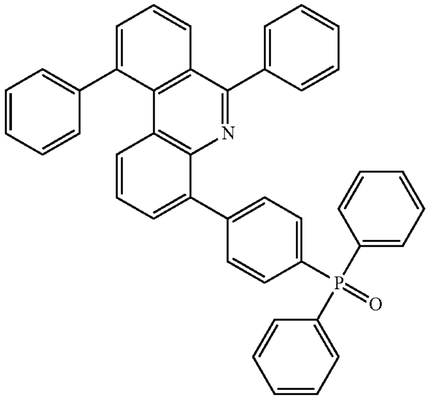
NCH-21
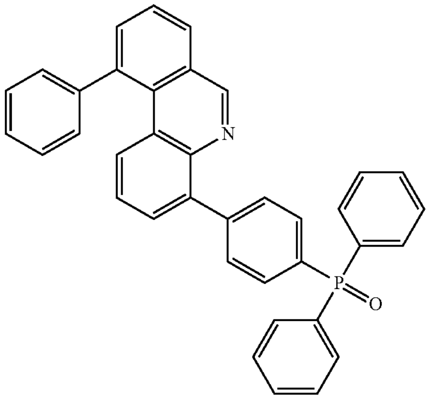
NCH-22
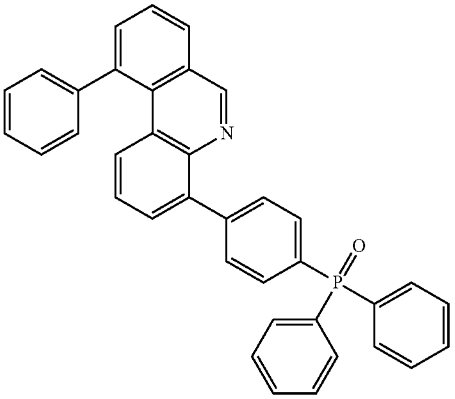

-continued

NCH-23

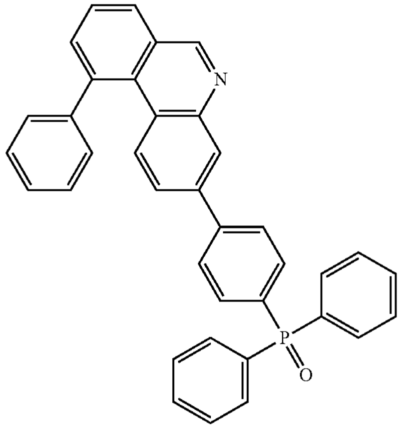

NCH-24

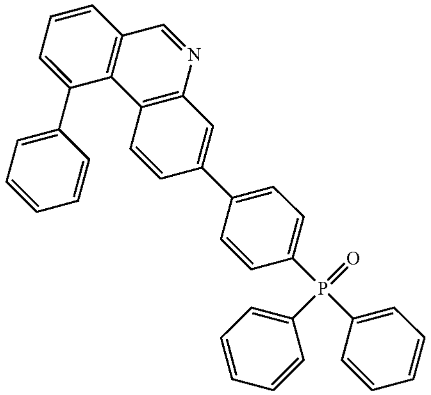

NCH-25

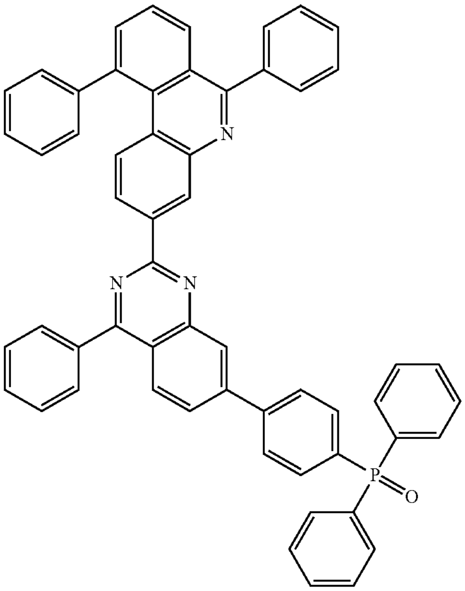

-continued

NCH-26

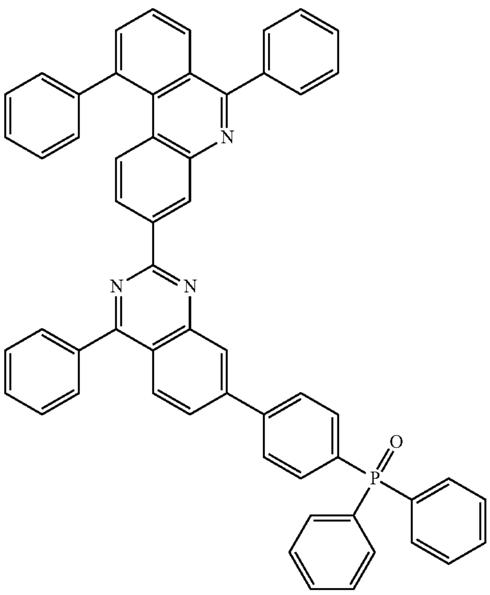

In addition, the light emitting device of the present disclosure utilizes a material represented by the following Formula 2 as an organic dopant that acts as a p-type dopant in the second host H2, contained as a main component in the hole generation layer pCGL adjacent to the electron generation layer nCGL.

[Formula 2]

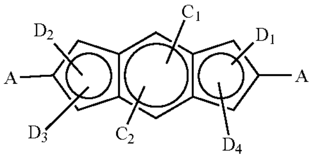

In one embodiment, A is selected from hydrogen, deuterium, a halogen group, a cyano group, a malononitrile group, a trifluoromethyl group, a trifluoromethoxy group, a substituted or unsubstituted aryl or heteroaryl group, a substituted or unsubstituted C1-C12 alkyl group, and a substituted or unsubstituted C1-C12 alkoxy group, and the substituents are each independently one of hydrogen and deuterium. For example, A may include at least one benzene ring or at least one phenyl ring. One site to three sites from the benzene ring or the phenyl ring may be substituted as one selected from fluorine, cyano, trifluoromethyl, and trifluoromethoxy.

In one embodiment, $C_1$ and $C_2$ are each independently one of hydrogen, deuterium, halogen, fluorine, or a cyano group.

In one embodiment, $D_1$ to $D_4$ are each independently connected by a single or double bond and are substituted with one of halogen, a cyano group, malononitrile, trifluoromethyl, and trifluoromethoxy, and at least two thereof include a cyano group.

The compound that can be represented by Formula 2 as the organic dopant PD of the hole generation layer pCGL may include the following compounds PD-04 to PD-36.

PD-04
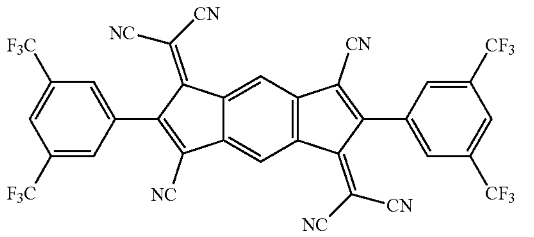
PD-05
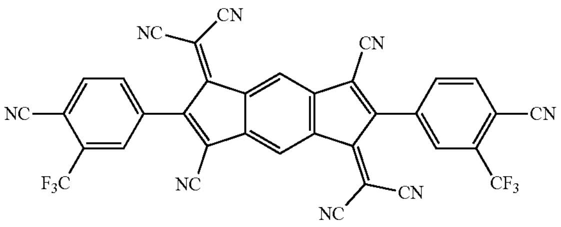
PD-06
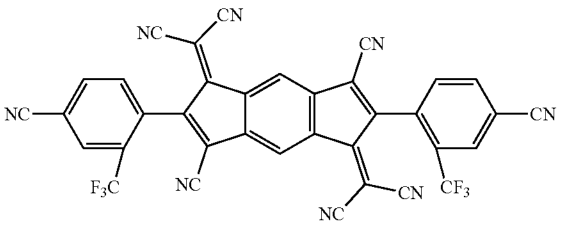
PD-07
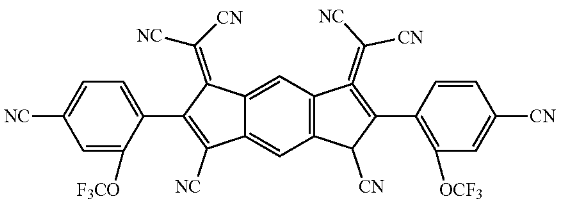
PD-08
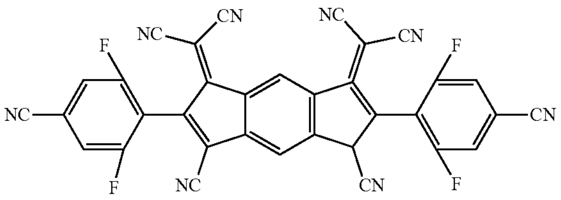
PD-09
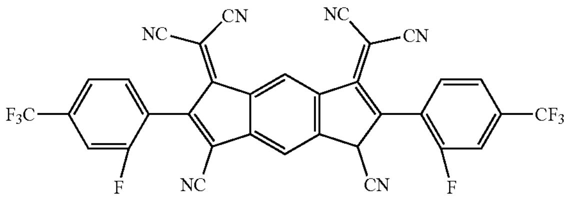
-continued
PD-10
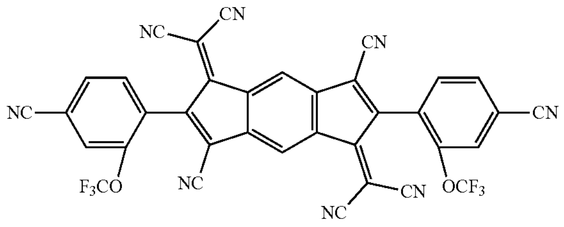
PD-11
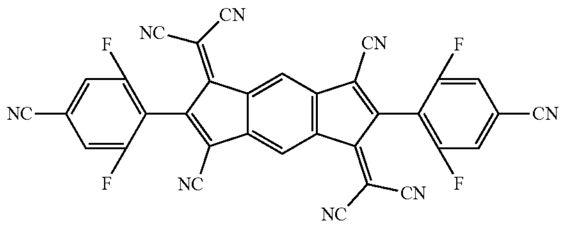
PD-12
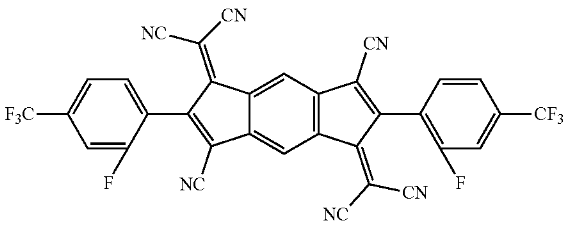
PD-13
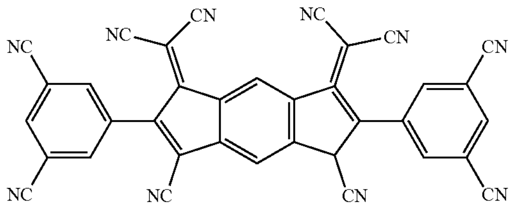
PD-14
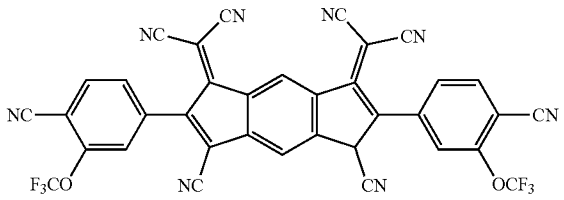
PD-15
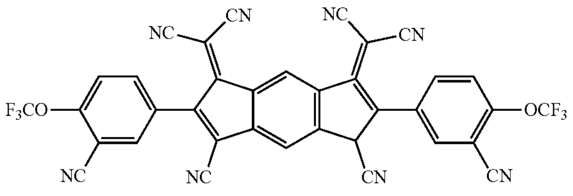

-continued
PD-16
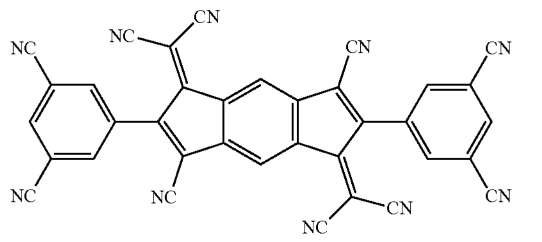
PD-17
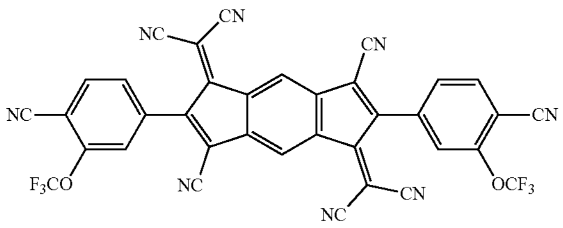
PD-18
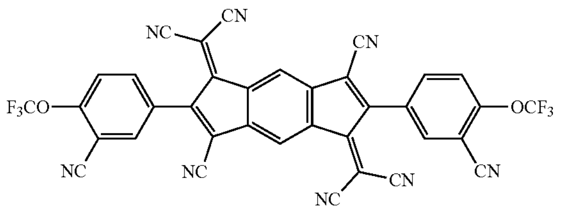
PD-19
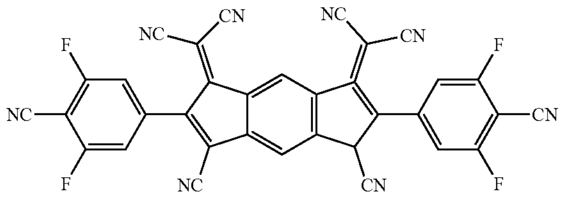
PD-20
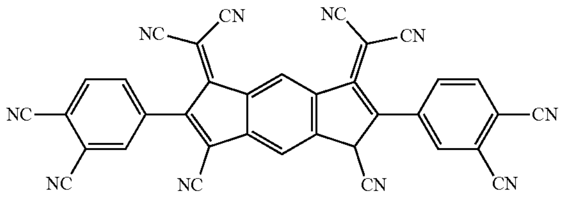
PD-21
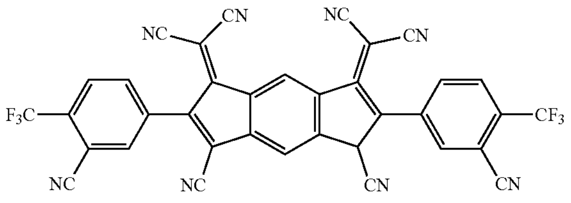
-continued
PD-22
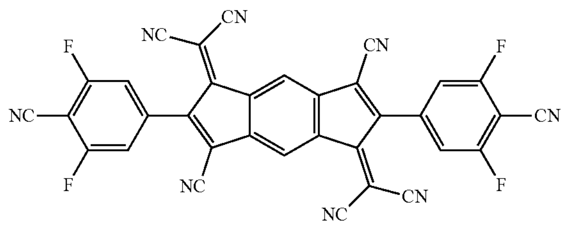
PD-23
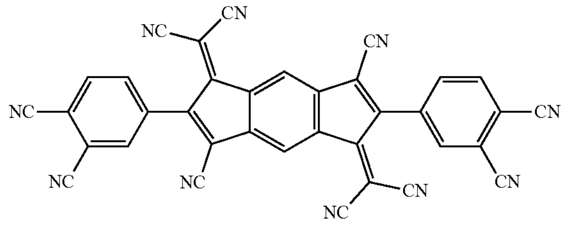
PD-24
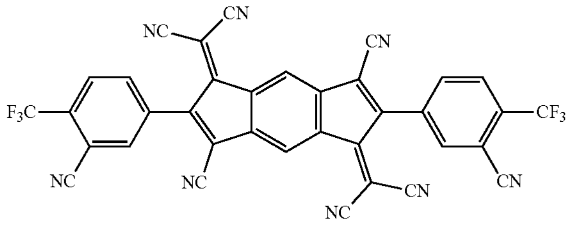
PD-25
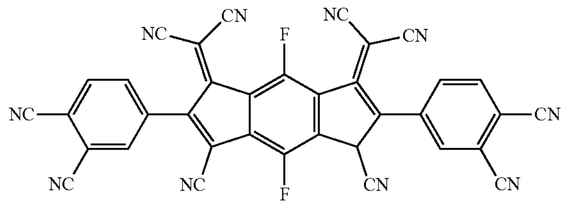
PD-26
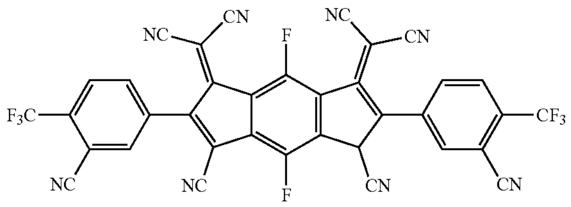
PD-27
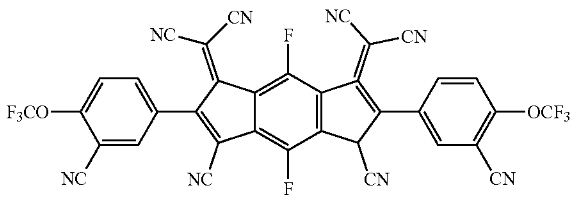

-continued
PD-28
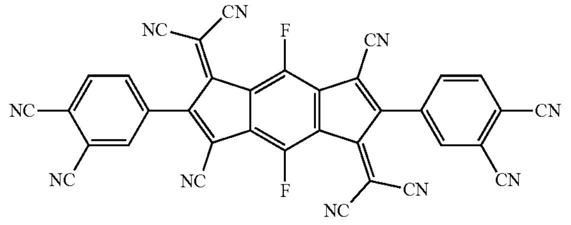
PD-29
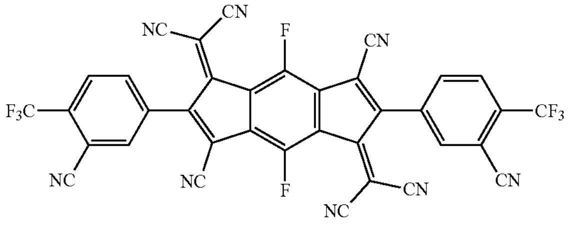
PD-30
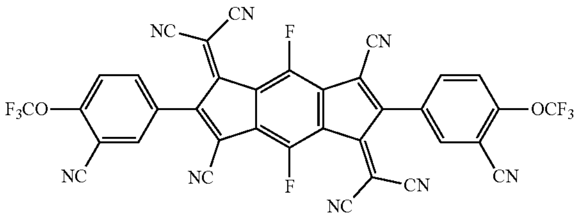
PD-31
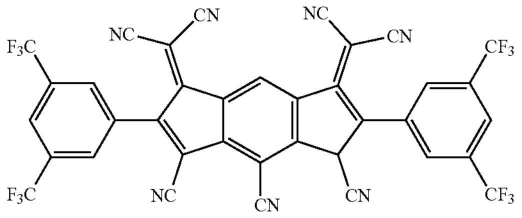
PD-32
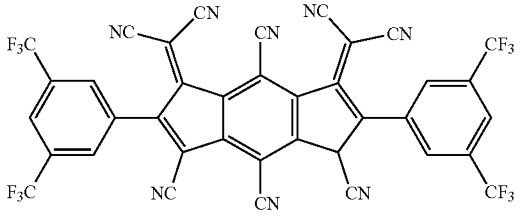
PD-33
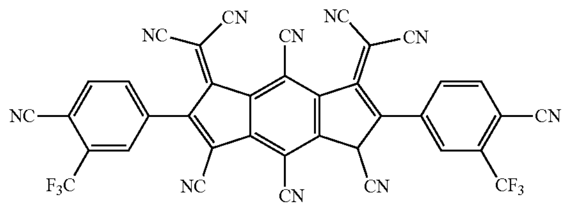
-continued
PD-34
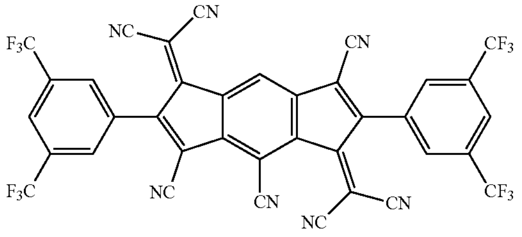
PD-35
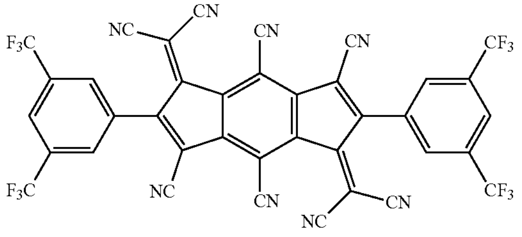
PD-36
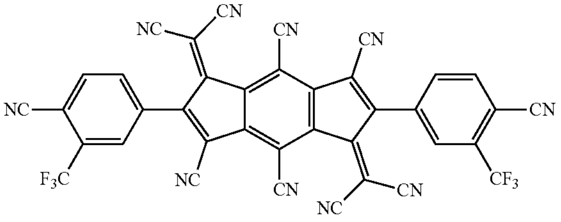
Meanwhile, the following PD-01 to PD-03 are p-type dopants, distinguished from the compound of Formula 2 of the present disclosure, which were used as controls with the first and second experimental examples groups in the experiments.
PD-01
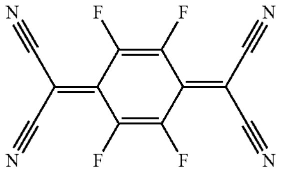
PD-02
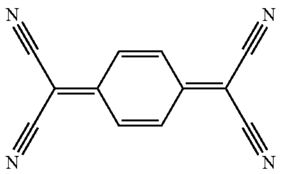

-continued

PD-03

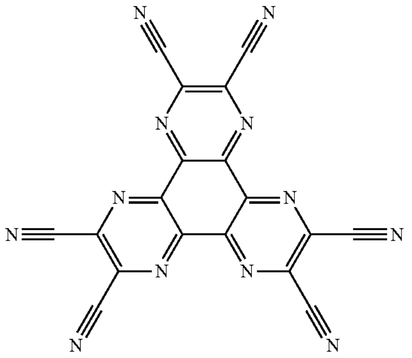

As an example of the white-light emitting device of the present disclosure, a light emitting device having a plurality of stacks, wherein the charge generation layer is formed by changing the first host of the electron generation layer and the organic dopant of the hole generation layer, was tested to determine the driving voltage, efficiency of realization of red, green, blue and white light, and color coordinates of white.

Figure 3:
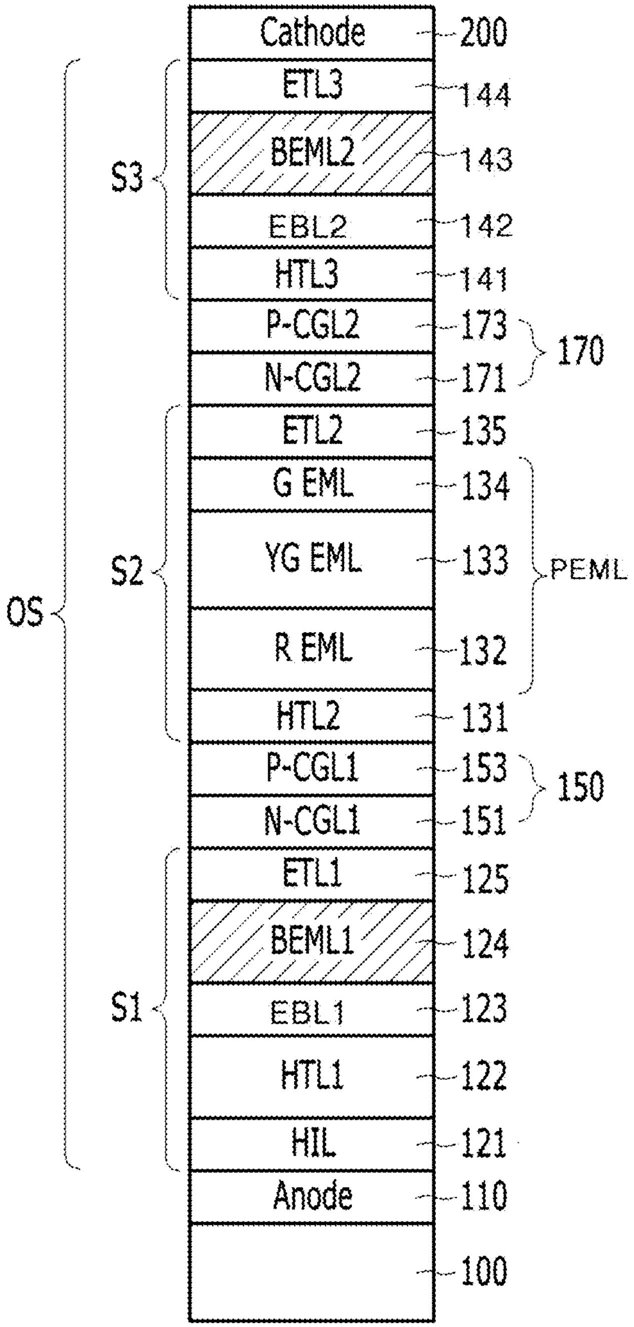
FIG. 3 is a detailed cross-sectional view illustrating a light emitting device according to an embodiment of the present disclosure.

FIG. 3 is a detailed cross-sectional view illustrating a light emitting device according to an embodiment of the present disclosure.

As shown in FIG. 3, the light emitting device according to an embodiment of the present disclosure includes a first electrode 110 and a second electrode 200 facing each other on a substrate 100, first to third stacks S1, S2, and S3 disposed between the first electrode 110 and the second electrode 200, and charge generation layers 150 and 170 disposed between the first to third stacks S1, S2, and S3.

In addition, the configuration between the first electrode 110 and the second electrode 200 may be referred to as an organic stack OS in that the main material is an organic material, or may be also referred to as an "internal stack" in that it is disposed between the first and second electrodes 110 and 200.

The first stack S1 is a stack emitting blue light, and includes a hole injection layer 121, a first hole transport layer 122, a first electron-blocking layer 123, a first blue light emitting layer 124, and a first electron transport layer 125.

The hole injection layer 121 is a layer that facilitates injection of holes from the first electrode 110, and may contain a hole-transporting material and a p-type dopant, or may contain an inorganic compound having a small difference in work function from the first electrode 110.

In addition, the first hole transport layer 122 functions to transfer holes from the hole injection layer 121 to the first blue light emitting layer 124.

Similar to the first hole transport layer 122, the first electron-blocking layer 123 functions to transport holes and prevent electrons from passing from the first blue light emitting layer 124 to the first hole transport layer 122. For this function, the LUMO level of the first electron-blocking layer 123 may be higher than the LUMO level of the host of the first blue light emitting layer 124.

The first blue light emitting layer 124 has an emission peak at a wavelength of 420 nm to 480 nm, and may contain a boron-based dopant or a pyrene-based dopant for this purpose.

In addition, the first electron transport layer 125 functions to transfer electrons generated by the adjacent electron generation layer 151 to the first blue light emitting layer 124.

The second stack S2 is a phosphorescent stack, and includes a second hole transport layer 131, a red light emitting layer 132, a yellow/green light emitting layer 133, a green light emitting layer 134, and a second electron transport layer 135. Here, the red light emitting layer 132, the yellow/green light emitting layer 133, and the green light emitting layer 134 are included in the phosphorescent light emitting unit PEML. The number of light emitting layers provided in the phosphorescent light emitting unit PEML may vary depending on the color gamut to be expressed by the light emitting device. For example, the phosphorescent light emitting unit PEML may include the red light emitting layer 132 and the green light emitting layer 134, or may further include a layer emitting light of a color between those emitted by the red light emitting layer 132 and the yellow/green light emitting layer 133, or between those emitted by the yellow/green light emitting layer 133 and the green light emitting layer 134, to express a wider range of colors.

The light emitting layers 132, 133, and 134 provided in the phosphorescent light emitting unit PEML may have different thicknesses or different dopant concentrations depending on the relative importance thereof in expressing white.

For example, the red light emitting layer 132 may have an emission peak at a wavelength of 600 nm to 650 nm, the yellow/green light emitting layer 133 may have an emission peak at a wavelength of 550 nm to 600 nm, and the green light emitting layer 134 may have an emission peak at a wavelength of 500 nm to 550 nm, but the present invention is not limited thereto, and any one light emitting layer may have an emission peak in a wider wavelength range.

The third stack S3 is the second blue stack, and has the same configuration as the first stack S1, which is a blue stack, except that the first stack S1 includes the hole injection layer 121. That is, the third stack S3 is a stack emitting blue light and includes a third hole transport layer 141, a second electron-blocking layer 142, a second blue light emitting layer 143, and a third electron transport layer 144.

Meanwhile, the second electrode 200 may further include an electron injection layer containing a compound of metal fluoride or a metal complex on the surface in contact with the third stack S3. The electron injection layer contains an inorganic component, and may be formed together in the process of forming the second electrode 200.

In addition, the light emitting device of the present disclosure includes a first charge generation layer 150 and a second charge generation layer 170 including electron generation layers 151 (n-CGL1) and 171 (n-CGL2) and hole generation layers 153 (p-CGL1) and 173 (p-CGL2) stacked between the first stack S1 and the second stack S2 and between the second stack S2 and the third stack S3.

The first to third experimental groups were tested under the condition that the first host H1 of the electron generation layer 151 and the organic dopant PD of the hole generation layer 153 were changed in the first charge generation layer 150 provided between the first stack S1 and the second stack S2, and the structure thereof is shown in Tables 1 to 3.

TABLE 1

| Item | Structure H1 (nCGL) | Structure PD (pCGL) | Voltage @0.1 Cd/m$^2$ (V) | Voltage @10 mA/cm$^2$ (V) | Voltage @50 mA/cm$^2$ (V) | R_Efficiency @10 mA/cm$^2$ (Cd/A) | G_Efficiency @10 mA/cm$^2$ (Cd/A) | B_Efficiency @10 mA/cm$^2$ (Cd/A) | W_Efficiency @10 mA/cm$^2$ (Cd/A) | CIEx | CIEy |
|---|---|---|---|---|---|---|---|---|---|---|---|
| Ex1-1 | Bphen | PD-03 | 11.05 | 13.67 | 16.80 | 6.7 | 23.90 | 3.86 | 67.4 | 0.311 | 0.358 |
| Ex1-2 | Bphen | PD-06 | 11.08 | 13.64 | 16.91 | 6.7 | 23.90 | 3.88 | 67.4 | 0.310 | 0.358 |
| Ex1-3 | Bphen | PD-10 | 11.13 | 13.57 | 17.00 | 6.7 | 23.88 | 3.88 | 67.4 | 0.310 | 0.358 |
| Ex1-4 | Bphen | PD-13 | 11.13 | 13.67 | 16.86 | 6.7 | 23.99 | 3.86 | 67.5 | 0.311 | 0.359 |
| Ex1-5 | Bphen | PD-15 | 11.06 | 13.66 | 16.81 | 6.6 | 23.76 | 3.8 | 67.0 | 0.311 | 0.359 |
| Ex1-6 | Bphen | PD-16 | 11.13 | 13.55 | 16.82 | 6.6 | 23.92 | 3.9 | 67.4 | 0.309 | 0.356 |
| Ex1-7 | Bphen | PD-19 | 11.14 | 13.63 | 16.95 | 6.7 | 23.94 | 3.9 | 67.5 | 0.310 | 0.358 |
| Ex1-8 | Bphen | PD-21 | 11.05 | 13.61 | 16.81 | 6.7 | 24.02 | 3.9 | 67.7 | 0.309 | 0.356 |
| Ex1-9 | Bphen | PD-25 | 11.06 | 13.53 | 16.97 | 6.7 | 24.00 | 3.9 | 67.6 | 0.310 | 0.359 |
| Ex1-10 | Bphen | PD-27 | 11.14 | 13.68 | 16.85 | 6.7 | 24.07 | 3.9 | 67.8 | 0.309 | 0.357 |
| Ex1-11 | Bphen | PD-28 | 11.02 | 13.51 | 16.84 | 6.7 | 23.88 | 3.9 | 67.3 | 0.310 | 0.357 |
| Ex1-12 | Bphen | PD-29 | 11.00 | 13.53 | 16.92 | 6.7 | 23.93 | 3.9 | 67.5 | 0.310 | 0.358 |
| Ex1-13 | Bphen | PD-30 | 11.08 | 13.57 | 16.81 | 6.7 | 24.06 | 3.9 | 67.8 | 0.309 | 0.357 |
| Ex1-14 | Bphen | PD-33 | 11.01 | 13.54 | 16.86 | 6.6 | 23.87 | 3.9 | 67.3 | 0.310 | 0.357 |
| Ex1-15 | Bphen | PD-35 | 11.08 | 13.66 | 16.93 | 6.6 | 23.80 | 3.9 | 67.2 | 0.310 | 0.357 |

First, a method of manufacturing the light emitting devices of the first experimental group (Ex1-1 to Ex1-15) will be described. The structure of the light emitting device of FIG. 3 is described below.

A first electrode 110 was formed using ITO, and then $MgF_2$ was deposited to a thickness of 5 nm to form a hole injection layer 121.

Then, DNTPD of Formula 3 was deposited to a thickness of 100 nm to form a first hole transport layer 122.

[Formula 3]

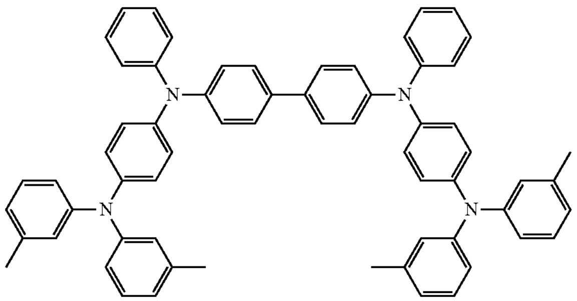

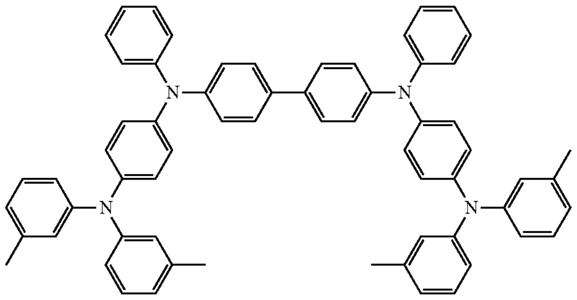

Then, TCTA of Formula 4 was deposited to a thickness of 5 nm to form a first electron-blocking layer 123.

[Formula 4]

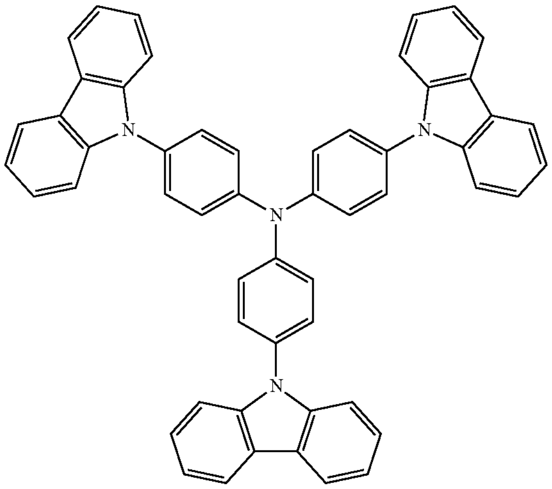

Then, MADN of Formula 5 as a host was doped at 5 wt % with a boron-based dopant of DABNA-1 of Formula 6 to form a blue light emitting layer 124 having a thickness of 20 nm.

[Formula 5]

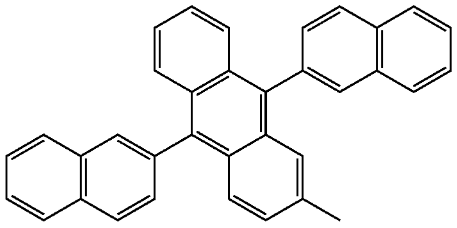

-continued

[Formula 6]

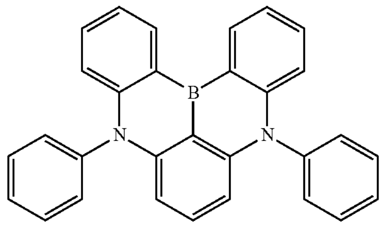

Then, ZADN of Formula 7 was formed to a thickness of 15 nm to form a first electron transport layer 125.

[Formula 7]

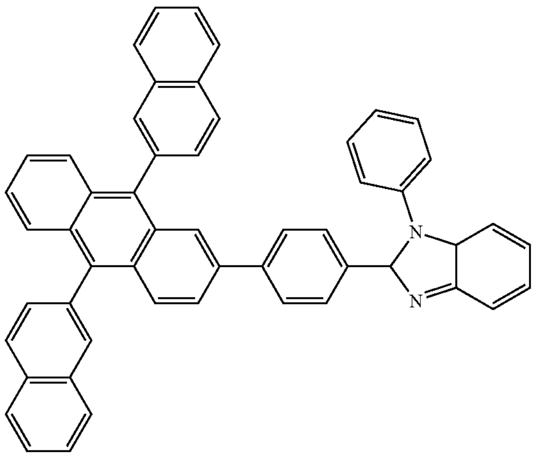

Then, Bphen of Formula 8 as a first host was doped at 3 wt % with Yb to form a first electron generation layer 151.

[Formula 8]

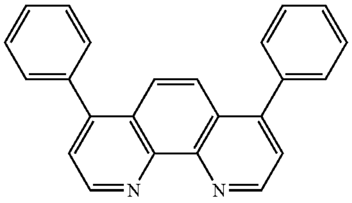

Then, a hole generation layer 153 having a thickness of 7 nm was formed by doping DNTPD as a second host at 20 wt % with an organic dopant, while the organic dopant was changed to PD-03, PD-06, PD-10, PD-13, PD-15, PD-16, PD-19, PD-21, PD-25, PD-27, PD-28, PD-29, PD-30, PD-33, or PD-35.

Then, BPBPA of Formula 9 was deposited to a thickness of 20 nm to form a second hole transport layer 131.

[Formula 9]

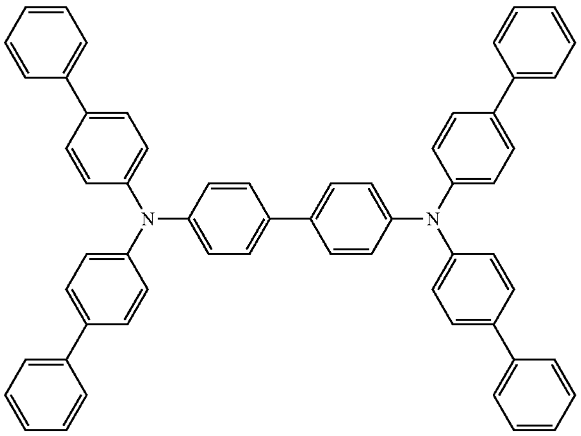

Then, BPBPA and TPBi of Formula 10 were co-deposited at a ratio of 1:1 and were then doped at 5 wt % with $Ir(piq)_2acac$ of Formula 11 to form a red light emitting layer 132 having a thickness of 10 nm.

[Formula 10]

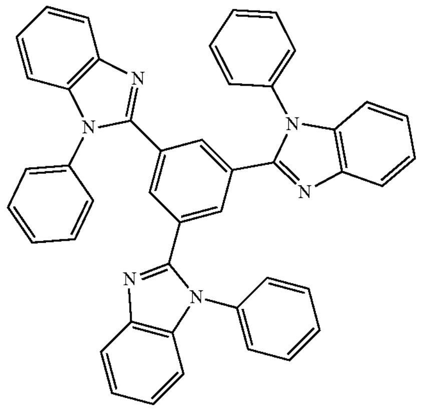

[Formula 11]

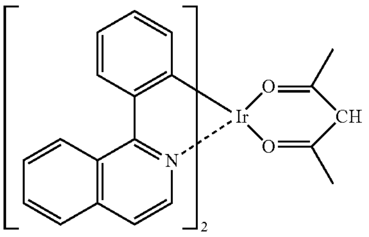

Then, a yellow/green light emitting layer 133 having a thickness of 20 nm was formed by doping CBP and TPBi of Formula 12 as hosts mixed at a weight ratio of 1:1 at 15 wt % with PO-01 of Formula 13.

[Formula 12]

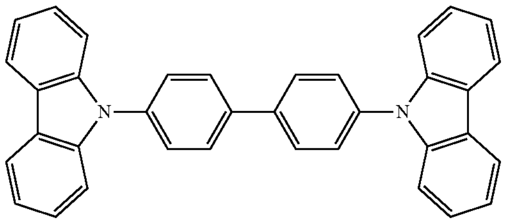

[Formula 13]

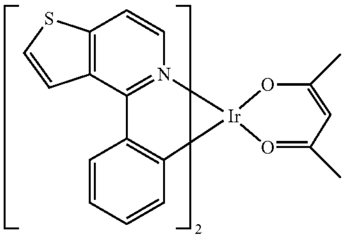

Then, a green light emitting layer 134 having a thickness of 10 nm was formed by doping CBP and TPBi as hosts mixed at a weight ratio of 1:1 at 15 wt % with $Ir(ppy)_3$ of Formula 14.

[Formula 14]

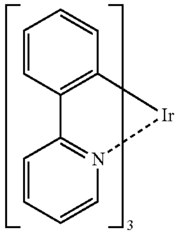

Then, TPBi was deposited to a thickness of 20 nm to form a second electron transport layer 135.

Then, a second electron generation layer 171 was formed by doping Bphen as a host at 3 wt % with Li.

Then, a second hole generation layer 173 was formed by doping DNTPD as a host at 20 wt % with the p-type dopant of PD-03.

Then, a third hole transport layer 141 was formed to a thickness of 100 nm using DNTPD.

Then, a second electron-blocking layer 142 was formed to a thickness of 5 nm using TCTA.

Then, a second blue light emitting layer 143 having a thickness of 20 nm was formed by doping MADN as a host at 5 wt % with DABNA-1.

Then, a third electron transport layer 144 was formed to a thickness of 20 nm using ZADN.

Then, LiF was deposited to a thickness of 1.5 nm to form an electron injection layer.

Then, Al was deposited to a thickness of 100 nm to form a cathode 200 and complete a light emitting device.

First, the turn-on voltage at a luminance of 0.1 Cd/m$^2$, the driving voltage at a current density of 10 mA/cm$^2$, the driving voltage at a current density of 50 mA/cm$^2$, the luminance efficiency of red, green, blue and white at a current density of 10 mA/cmz and white color coordinates were comparatively evaluated in the first experimental example group (Ex1-1 to Ex1-15) of Table 1.

The first experimental example group (Ex1-1 to Ex1-15) contains a phenanthroline compound as the first host H1 in the first electron generation layer 151, and the doped Yb and the phenanthroline compound in the first electron generation layer 151 do not operate smoothly, and thus the turn-on voltage is 11.0 V or higher even if a hole generation layer 153 containing any kind of organic dopant PD is then formed thereon.

Hereinafter, the second experimental example group (Ex2-1 to Ex2-15) contains phenenathridine and phosphine oxide of Formula 1 as the material of the first host H1 in the first electron generation layer 151, the material is changed to NCH-01, NCH-03, NC-05, NCH-07, NCH-08, NCH-10, NCH-12, NCH-13, NCH-15, NCH-16, NCH-18, NCH-20, NCH-22, NCH-23, or NCH-24, and the organic dopant PD of the first hole generation layer 153 is fixed at PD-03.

TABLE 2

| Item | Structure H1 (nCGL) | Structure PD (pCGL) | Voltage@ 0.1 Cd/ m$^2$ (V) | Voltage@ 10 mA/ cm$^2$ (V) | Voltage@ 50 mA/ cm$^2$ (V) | R_Efficiency @10 mA/ cm$^2$ (Cd/A) | G_Efficiency @10 mA/ cm$^2$ (Cd/A) | B_Efficiency @10 mA/ cm$^2$ (Cd/A) | W_Efficiency @10 mA/ cm$^2$ (Cd/A) | CIEx | CIEy |
|---|---|---|---|---|---|---|---|---|---|---|---|
| Ex2-1 | NCH-01 | PD-03 | 9.05 | 12.01 | 14.13 | 6.7 | 23.99 | 3.9 | 67.6 | 0.310 | 0.358 |
| Ex2-2 | NCH-03 | PD-03 | 9.16 | 12.19 | 14.09 | 6.7 | 23.99 | 3.9 | 67.6 | 0.310 | 0.358 |
| Ex2-3 | NCH-05 | PD-03 | 9.00 | 12.19 | 14.06 | 6.7 | 23.91 | 3.9 | 67.4 | 0.310 | 0.357 |
| Ex2-4 | NCH-07 | PD-03 | 9.01 | 12.06 | 14.05 | 6.7 | 24.02 | 3.9 | 67.6 | 0.311 | 0.360 |
| Ex2-5 | NCH-08 | PD-03 | 9.13 | 12.16 | 14.05 | 6.7 | 23.85 | 3.9 | 67.3 | 0.311 | 0.358 |
| Ex2-6 | NCH-10 | PD-03 | 9.08 | 12.19 | 14.19 | 6.7 | 23.93 | 3.9 | 67.5 | 0.310 | 0.357 |
| Ex2-7 | NCH-12 | PD-03 | 9.10 | 12.17 | 14.20 | 6.7 | 24.14 | 3.9 | 67.9 | 0.311 | 0.360 |
| Ex2-8 | NCH-13 | PD-03 | 9.06 | 12.14 | 14.13 | 6.6 | 23.79 | 3.9 | 67.2 | 0.310 | 0.356 |
| Ex2-9 | NCH-15 | PD-03 | 9.06 | 12.15 | 14.16 | 6.7 | 23.82 | 3.8 | 67.2 | 0.311 | 0.359 |
| Ex2-10 | NCH-16 | PD-03 | 9.14 | 12.06 | 14.15 | 6.6 | 23.81 | 3.9 | 67.1 | 0.310 | 0.357 |
| Ex2-11 | NCH-18 | PD-03 | 9.16 | 12.05 | 14.11 | 6.7 | 24.09 | 3.9 | 67.8 | 0.309 | 0.357 |
| Ex2-12 | NCH-20 | PD-03 | 9.20 | 12.19 | 14.20 | 6.7 | 24.03 | 3.8 | 67.6 | 0.311 | 0.360 |
| Ex2-13 | NCH-22 | PD-03 | 9.08 | 12.18 | 14.16 | 6.7 | 23.90 | 3.8 | 67.4 | 0.311 | 0.359 |
| Ex2-14 | NCH-23 | PD-03 | 9.06 | 12.18 | 14.16 | 6.7 | 23.91 | 3.9 | 67.4 | 0.309 | 0.356 |
| Ex2-15 | NCH-24 | PD-03 | 9.16 | 12.08 | 14.11 | 6.6 | 23.88 | 3.9 | 67.3 | 0.310 | 0.357 |

As shown in Table 2, the second experimental group (Ex2-1 to Ex2-15) contains a phenanthridine and a phosphine-oxide-based compound as the material of the first host H1 in the first electron generation layer 151. In general, in all experimental examples, the first hosts H1 act along with doped Yb to reduce the turn-on voltage at a luminance of 0.1 $Cd/m^2$ to 9V. That is, by changing the first host in the first electron generation layer 151 to the material of Formula 1, a meaningful (significant) result of lowering the driving voltage along with the interaction of the metal dopant can be obtained.

The third experimental example group (Ex3-1 to Ex3-15) of Table 3 contains phenanthridine and phosphine oxide of Formula 1 as the material of the first host H1 in the first electron generation layer 151, and contains, as the organic dopant PD of the first hole generation layer 153, PD-4, PD-5, PD-6, PD-10, PD-13, PD-15, PD-16, PD-19, PD-21, PD-25, PD-27, PD-28, PD-29, PD-30, PD-33, or PD-35, like the material of Formula 2.

generation layer. However, when ytterbium is applied, as in the first experimental example group, most of the driving voltages are increased, which imposes a burden of increased power consumption or the driving circuit unit. The light emitting device of the present disclosure is capable of greatly improving the driving voltage of the device by simultaneously using an electron generation layer host material suitable for ytterbium and a hole-generating dopant material having excellent hole generation and transport ability.

Further, the improvement in the driving voltage enables the same luminance to be realized with a small driving voltage in a light emitting display device, thus advantageously securing the lifespan stability of the light emitting display device when operated for a long period of time.

Meanwhile, in the first to third experimental example groups, only the material of the first charge generation layer was changed in order to determine the significance of the host material of Formula 1 in the electron generation layer

TABLE 3

| | Structure | | Voltage @ 0.1 cd/ | Voltage @ 10 mA/ | Voltage @ 50 mA/ | R_Efficiency @10 mA/ | G_Efficiency @10 mA/ | B_Efficiency @10 mA/ | W_Efficiency @10 mA/ | | |
|---|---|---|---|---|---|---|---|---|---|---|---|
| Item | H1 (nCGL) | PD (pCGL) | $m^2$ (V) | $cm^2$ (V) | $cm^2$ (V) | $cm^2$ (cd/A) | $cm^2$ (cd/A) | $cm^2$ (cd/A) | $cm^2$ (cd/A) | CIEx | CIEy |
| Ex3-1 | NCH-01 | PD-04 | 8.65 | 11.52 | 13.57 | 6.7 | 23.98 | 3.9 | 67.5 | 0.311 | 0.359 |
| Ex3-2 | NCH-03 | PD-06 | 8.55 | 11.56 | 13.58 | 6.7 | 23.95 | 3.8 | 67.5 | 0.311 | 0.359 |
| Ex3-3 | NCH-05 | PD-10 | 8.54 | 11.50 | 13.69 | 6.7 | 23.94 | 3.9 | 67.5 | 0.309 | 0.356 |
| Ex3-4 | NCH-07 | PD-13 | 8.67 | 11.58 | 13.59 | 6.7 | 24.02 | 3.9 | 67.6 | 0.311 | 0.360 |
| Ex3-5 | NCH-08 | PD-15 | 8.60 | 11.57 | 13.65 | 6.7 | 23.87 | 3.9 | 67.3 | 0.311 | 0.359 |
| Ex3-6 | NCH-10 | PD-16 | 8.65 | 11.57 | 13.62 | 6.6 | 23.76 | 3.9 | 67.0 | 0.310 | 0.358 |
| Ex3-7 | NCH-12 | PD-19 | 8.69 | 11.55 | 13.55 | 6.6 | 23.91 | 3.9 | 67.4 | 0.309 | 0.356 |
| Ex3-8 | NCH-13 | PD-21 | 8.63 | 11.50 | 13.53 | 6.7 | 23.98 | 3.9 | 67.6 | 0.310 | 0.357 |
| Ex3-9 | NCH-15 | PD-25 | 8.51 | 11.56 | 13.62 | 6.7 | 24.00 | 3.9 | 67.6 | 0.311 | 0.359 |
| Ex3-10 | NCH-16 | PD-27 | 8.64 | 11.66 | 13.55 | 6.6 | 23.95 | 3.9 | 67.5 | 0.309 | 0.356 |
| Ex3-11 | NCH-18 | PD-28 | 8.55 | 11.64 | 13.51 | 6.6 | 23.84 | 3.8 | 67.2 | 0.311 | 0.359 |
| Ex3-12 | NCH-20 | PD-29 | 8.54 | 11.65 | 13.66 | 6.7 | 23.96 | 3.8 | 67.5 | 0.311 | 0.359 |
| Ex3-13 | NCH-22 | PD-30 | 8.67 | 11.67 | 13.62 | 6.7 | 24.05 | 3.9 | 67.7 | 0.310 | 0.358 |
| Ex3-14 | NCH-23 | PD-33 | 8.53 | 11.64 | 13.54 | 6.6 | 23.76 | 3.9 | 67.1 | 0.310 | 0.357 |
| Ex3-15 | NCH-24 | PD-35 | 8.62 | 11.63 | 13.69 | 6.7 | 24.07 | 3.9 | 67.8 | 0.310 | 0.358 |

In the third experimental example group (Ex3-1 to Ex3-15), the turn-on voltage at a luminance of 0.1 $Cd/m^2$ was decreased to 8.5V, which means that the third experimental example group is more effective in reducing driving voltage compared to the second experimental group (Ex2-1 to Ex2-15).

Figure 4A:
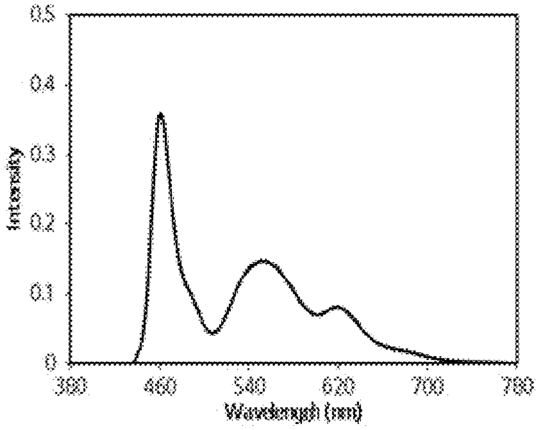
FIGS. 4A to 4C are graphs illustrating emission spectra of light emitting devices according to first to third experimental example groups.
Figure 4B:
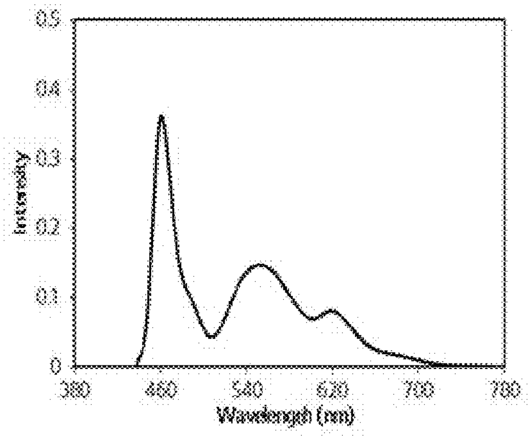
Figure 4C:
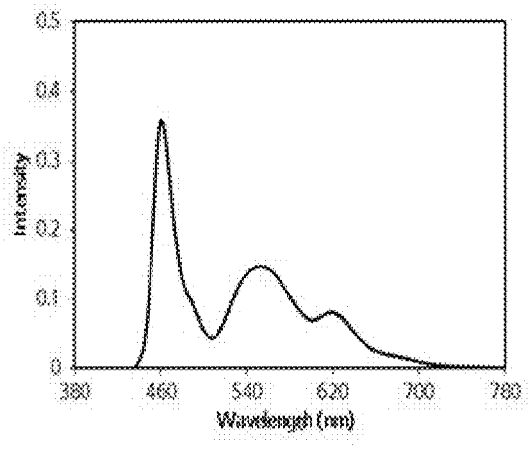

FIGS. 4A to 4C are graphs illustrating emission spectra of light emitting devices according to first to third experimental example groups.

As can be seen from FIGS. 4A to 4C and Tables 1 to 3 above, the first experimental example group (Ex1-1 to Ex1-15), the second experimental example group (Ex2-1 to Ex2-15), and the third experimental example group (Ex3-1~Ex3-15) have similar color characteristics.

Considering the significance of the first to third experimental example groups (Ex1-1 to Ex1-15, Ex2-1 to Ex2-15, Ex3-1 to Ex3-15) in relation to Tables 1 to 3, when the host of the electron generation layer doped with the metal dopant is used as the material of Formula 1 to implement the same white color, an effect of reducing driving voltage can be obtained due to compatible operation between the metal dopant and the host, which means that the driving voltage is reduced compared to when the material of Formula 2 is used as the organic dopant for the hole generation layer, as well as the electron generation layer.

In order to prevent lateral leakage current, ytterbium (Yb) rather than an alkali metal is mainly applied to the electron and the organic dopant of Formula 2 in the hole generation layer. However, the light emitting device of the present disclosure is not limited thereto. If charge generation is required due to a connection configuration that connects different stacks, the host material of Formula 1 described above may be used for the electron generation layer and the organic dopant material of Formula 2 may be used for the hole generation layer.

For example, the configuration of the first charge generation layer 150 (151, 153) used in the third experimental example group may also be used for the second charge generation layer 170 of FIG. 3.

In addition, the light emitting device of the present disclosure is not limited to the three-stack structure shown in FIG. 3, and may be applied to any charge generation layer for connecting a plurality of stacks. Even if the host of Formula 1 is used for at least the electron generation layer, an effect of reducing driving voltage can be obtained, and when the organic dopant of Formula 2 is used for the hole generation layer, an improved effect of reducing driving voltage can be obtained.

The organic dopant PD is present in an amount of 1 wt % to 30 wt % in the hole generation layer pCGL, and the metal dopant ND is present in an amount of 0.1 wt % to 5 wt % in the electron generation layer.

When the metal dopant ND is present in excess, it diffuses horizontally. Thus, the metal dopant ND is present in a smaller amount than the amount of the organic dopant PD present in the hole generation layer.

Meanwhile, the host contained in the electron generation layer nCGL does not include phenanthroline. Phenanthroline may not function well as a metal dopant when the metal dopant contained in the electron generation layer nCGL is Yb, thus causing an increase in driving voltage. When the metal dopant is Yb, it is preferable to use, as a host, a compound represented by Formula 1 that contains phosphine oxide, is reactive with Yb, and controls diffusion.

Hereinafter, a light emitting display device using the light emitting device according to the present disclosure will be described.

Figure 5:
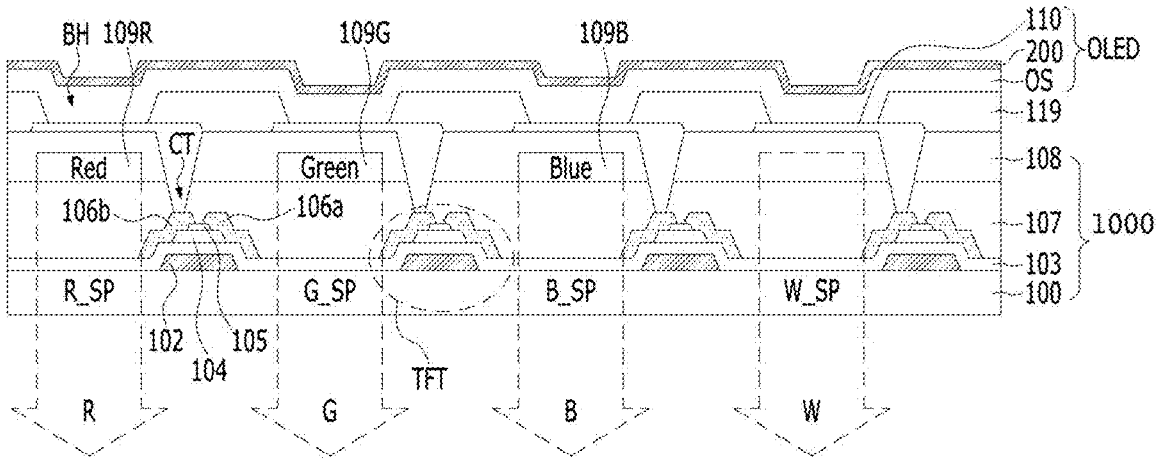
FIG. 5 is a cross-sectional view illustrating a light emitting display device according to an embodiment of the present disclosure.

FIG. 5 is a cross-sectional view illustrating a light emitting display device using the light emitting device according to an embodiment of the present disclosure.

As shown in FIG. 5, the light emitting display device of the present disclosure includes a substrate 100 having a plurality of subpixels R_SP, G_SP, B_SP, and W_SP, a light emitting device (also referred to as “OLED, organic light emitting diode”) commonly provided on the substrate 100, a thin film transistor (TFT) provided at each of the subpixels and connected to the first electrode 110 of the light emitting device (OLED), and a color filter layer 109R, 109G, or 109B provided below the first electrode 110 of at least one of the subpixels.

The illustrated example relates to a configuration including the white subpixel W_SP, but the present invention is not limited thereto. A configuration in which the white subpixel W_SP is omitted and only the red, green, and blue subpixels R_SP, G_SP, and B_SP are provided is also possible. In some cases, a combination of a cyan subpixel, a magenta subpixel, and a yellow subpixel capable of creating white by replacing the red, green, and blue subpixels is possible.

The thin film transistor TFT includes, for example, a gate electrode 102, a semiconductor layer 104, and a source electrode 106*a* and a drain electrode 106*b* connected to respective sides of the semiconductor layer 104. In addition, a channel protection layer 105 may be further provided on the portion where the channel of the semiconductor layer 104 is located in order to prevent direct connection between the source/drain electrodes 106*a* and 106*b* and the semiconductor layer 104.

A gate insulating layer 103 is provided between the gate electrode 102 and the semiconductor layer 104.

The semiconductor layer 104 may be formed of, for example, an oxide semiconductor, amorphous silicon, polycrystalline silicon, or a combination thereof. For example, when the semiconductor layer 104 is an oxide semiconductor, the heating temperature required for forming the thin film transistor can be lowered, and thus the substrate 100 can be selected from among a greater variety of available types thereof, so the semiconductor layer 104 can be advantageously applied to a flexible display device.

In addition, the drain electrode 106*b* of the thin film transistor TFT may be connected to the first electrode 110 in a contact hole CT provided in the first and second passivation layers 107 and 108.

The first passivation layer 107 is provided to primarily protect the thin film transistor TFT, and color filters 109R, 109G, and 109B may be provided thereon.

When the plurality of subpixels includes a red subpixel, a green subpixel, a blue subpixel, and a white subpixel, the color filter may include first to third color filters in the remaining subpixels 109R, 109G, and 109B, respectively, excluding the white subpixel W_SP, and allows the emitted white light to pass through the first electrode 110 for each wavelength. A second passivation layer 108 is formed under the first electrode 110 to cover the first to third color filters 109R, 109G, and 109B. The first electrode 110 is formed on the surface of the second passivation layer 108 excluding the contact hole CT.

Here, a configuration including the substrate 100, the thin film transistor TFT, the color filters 109R, 109G, and 109B, and the first and second passivation layers 107 and 108 is referred to as a “thin film transistor array substrate” 1000.

Additionally, the light emitting device (OLED) is characterized by the configuration of the charge generation layer between a plurality of stacks, thereby having the effect of reducing the driving voltage. Accordingly, when such a light emitting device is applied to a light emitting display device, it is possible to obtain effects of reducing the driving voltage at an equivalent level or more and improving the lifespan of the light emitting display device.

In one aspect, a light emitting device includes a first electrode and a second electrode facing each other, a plurality of stacks provided between the first electrode and the second electrode, and a charge generation layer including an electron generation layer and a hole generation layer stacked between the stacks, wherein the electron generation layer contains a first host of Formula 1 and a metal dopant, and the hole generation layer contains a second host and an organic dopant,

[Formula 1]

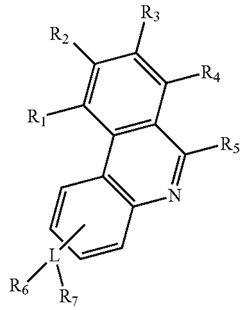

wherein $R_1$ to $R_6$ are selected from a cycloalkyl group, an aryl group and a heteroaryl group, $R_7$ is triphenylphosphine oxide, and L is selected from quinazoline and pyrimidine.

The organic dopant may be represented by Formula 2 below:

[Formula 2]

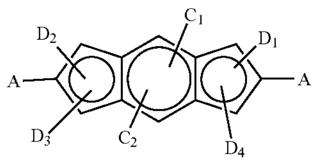

A may be selected from hydrogen, deuterium, a halogen group, a cyano group, a malononitrile group, a trifluoromethyl group, a trifluoromethoxy group, a substituted or unsubstituted aryl or heteroaryl group, a substituted or unsubstituted C1-C12 alkyl group, and a substituted or unsubstituted C1-C12 alkoxy group. The substituent may be each independently one of hydrogen and deuterium. $C_1$ and $C_2$ may be each independently one of hydrogen, deuterium, halogen, or a cyano group. Also, $D_1$ to $D_4$ may be each independently connected by a single or double bond, and are substituted with one of halogen, a cyano group, malononitrile, trifluoromethyl, and trifluoromethoxy, and at least two thereof include a cyano group.

The organic dopant may be present in an amount of 1 wt % to 30 wt % in the hole generation layer, and the metal dopant may be present in an amount of 0.1 wt % to 5 wt % in the electron generation layer.

The metal dopant may be Yb.

The first host may not contain phenanthroline.

The second host may be an amine-based compound different from the hole transport layer of an adjacent stack.

The electron generation layer may contact an organic layer of an adjacent stack containing a compound including anthracene as a core.

In another aspect of the present disclosure, a light emitting device includes a first electrode and a second electrode facing each other, a blue stack disposed adjacent to the first electrode, the blue stack including a first hole transport layer, a blue light emitting layer and a first electron transport layer, a phosphorescent stack disposed adjacent to the second electrode, the phosphorescent stack including a second hole transport layer, a phosphorescent light emitting portion including at least two light emitting layers having a wavelength longer than blue light, and a second electron transport layer, and a charge generation layer including an electron generation layer and a hole generation layer stacked between the blue stack and the phosphorescent stack, wherein the electron generation layer includes a first host of Formula 1, and the hole generation layer includes an organic dopant of Formula 2.

The organic dopant in the hole generation layer may be included in an amine-based second host, and an amount of the second host in the hole generation layer may be greater than an amount of the organic dopant therein.

The electron generation layer may contact the first electron transport layer, and the hole generation layer may contact the second hole transport layer.

In another aspect of the present disclosure, a light emitting device includes a first electrode and a second electrode facing each other, a blue stack disposed adjacent to the first electrode, the blue stack including a first hole transport layer, a blue light emitting layer, and a first electron transport layer, a phosphorescent stack disposed adjacent to the second electrode, the phosphorescent stack including a second hole transport layer, a phosphorescent light emitting portion including at least two light emitting layers having a wavelength longer than blue light, which are connected to one another, and a second electron transport layer, wherein the electron generation layer contains a first host of Formula 1, and the hole generation layer contains an organic dopant of Formula 2.

In another aspect of the present disclosure, a light emitting display device includes a substrate including a plurality of subpixels, a thin film transistor provided at each of the subpixels on the substrate, and the light emitting device connected to the thin film transistor.

The light emitting device of the present disclosure and a light emitting display device including the same have the following effects.

In a structure for connecting a plurality of stacks between the first electrode and the second electrode, a small amount of metal dopant is included in the electron generation layer for generating electrons. In this case, the metal dopant is used to limit the lateral leakage current, and it is essential to control the driving voltage in the vertical direction according to the metal dopant that is used. The light emitting device of the present disclosure uses phenanthridine and a phosphine-oxide-based compound capable of providing compatible operation between the host and the metal dopant as the host used for the electron generation layer, thereby preventing lateral leakage current and reducing the driving voltage.

In addition, the driving voltage can be further reduced by changing the material of the organic dopant for the hole generation layer as well as the electron generation layer.

It will be apparent to those skilled in the art that various modifications and variations can be made in the present invention without departing from the spirit or scope of the invention. Thus, it is intended that the present invention covers such modifications and variations thereto, provided they fall within the scope of the appended claims and their equivalents.

What is claimed is:

1. A light emitting device comprising:

a first electrode and a second electrode;

a plurality of stacks between the first electrode and the second electrode; and a charge generation layer between two stacks, the charge generation layer comprising an electron generation layer and a hole generation layer, wherein the electron generation layer comprises a first host represented by Formula 1 and a metal dopant, and

[Formula 1]

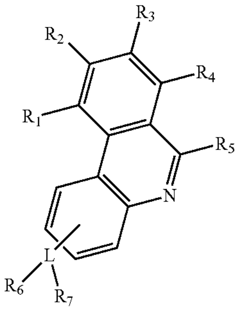

wherein $R_1$ to $R_6$ are independently selected from a cycloalkyl group, an aryl group, and a heteroaryl group;

$R_7$ is triphenylphosphine oxide; and

L is selected from quinazoline and pyrimidine, wherein the hole generation layer comprises a second host and an organic dopant.

2. The light emitting device according to claim 1, wherein the organic dopant is represented by Formula 2 below:

[Formula 2]

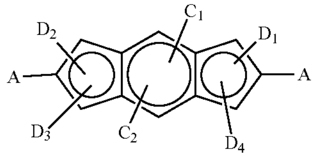

wherein A is selected from hydrogen, deuterium, a halogen group, a cyano group, a malononitrile group, a trifluoromethyl group, a trifluoromethoxy group, a substituted or unsubstituted aryl or heteroaryl group, a substituted or unsubstituted C1-C12 alkyl group, and a substituted or unsubstituted C1-C12 alkoxy group, and the substituent of each of the substituted heteroaryl group, the substituted C1-C12 alkyl group and the substituted C1-C12 alkoxy group is independently one of a halogen group, a cyano group, a malononitrile group, a trifluoromethyl group and a trifluoromethoxy group;

$C_1$ and $C_2$ are each independently one of hydrogen, deuterium, halogen, or a cyano group; and $D_1$ to $D_4$ are each independently connected by a single or double bond, and are substituted with one of halogen, a cyano group, malononitrile, trifluoromethyl, and trifluoromethoxy, and at least two thereof include a cyano group.

3. The light emitting device according to claim 2, wherein the second host is selected from:

PD-04

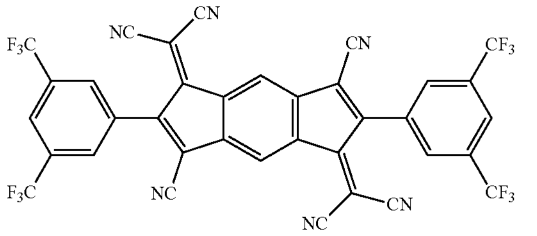

PD-05

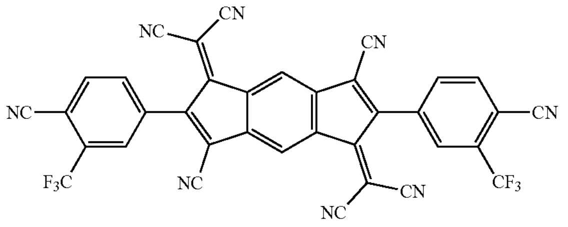

PD-06

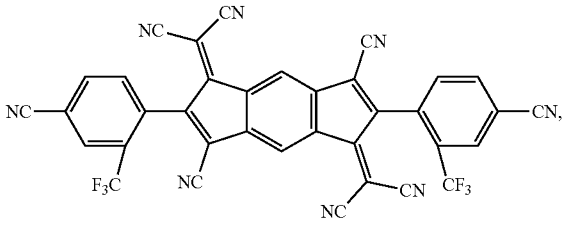

PD-07

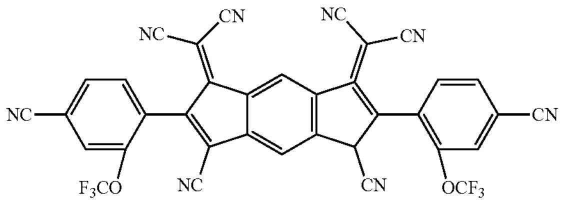

PD-08

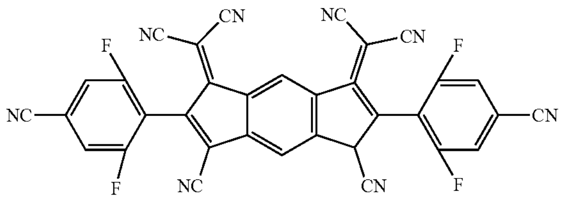

-continued

PD-09

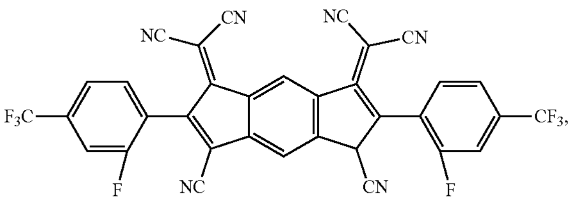

PD-10

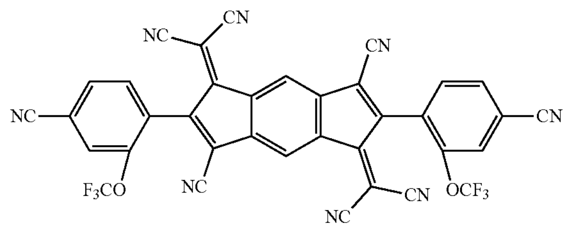

PD-11

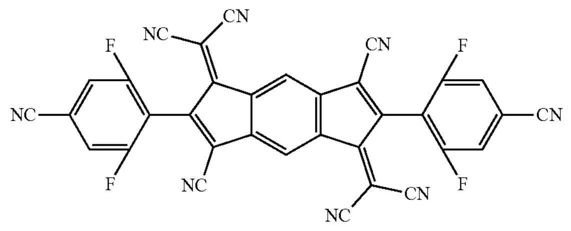

PD-12

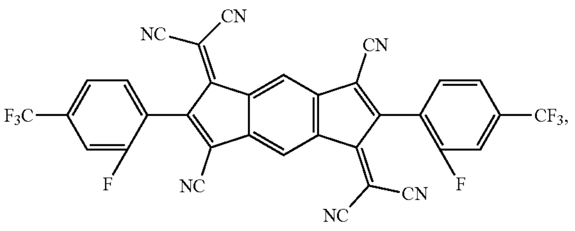

PD-13

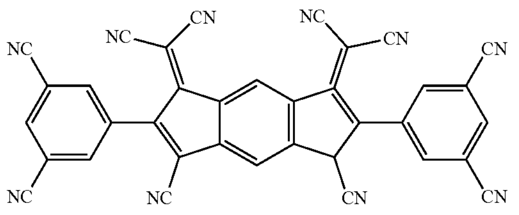

PD-14

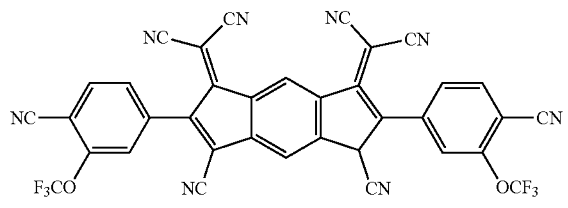

PD-15

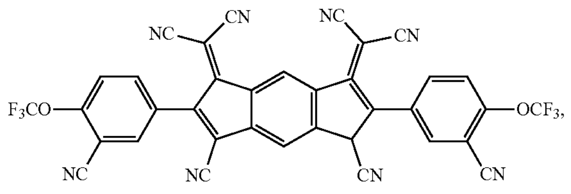

-continued
PD-16
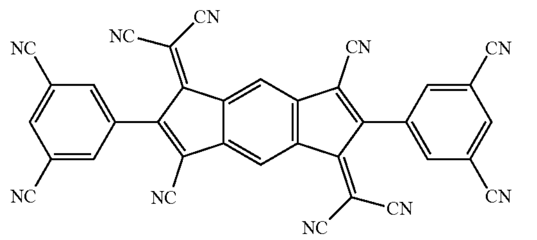
PD-17
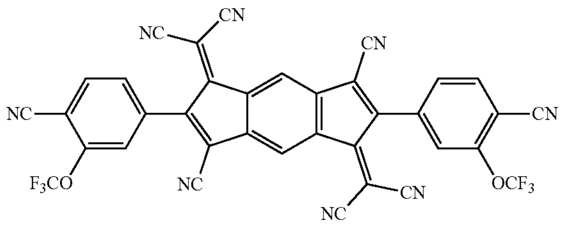
PD-18
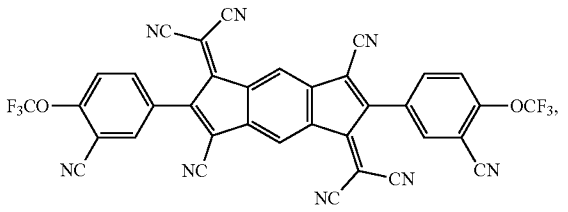
PD-19
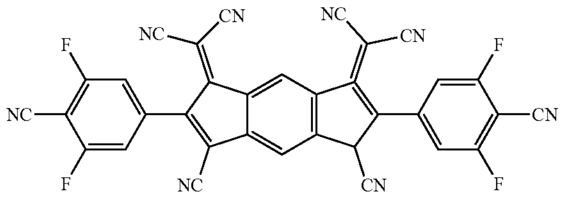
PD-20
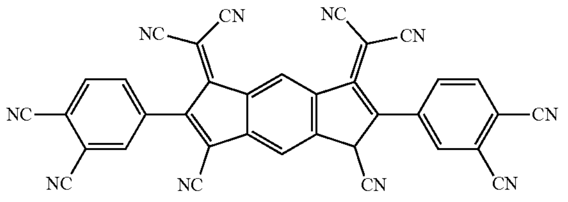
PD-21
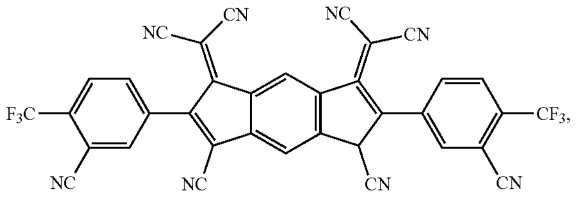
-continued
PD-22
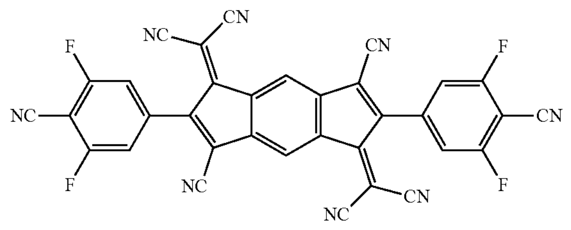
PD-23
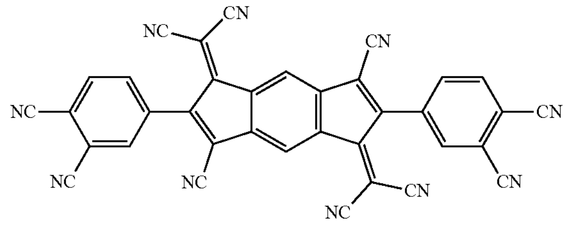
PD-24
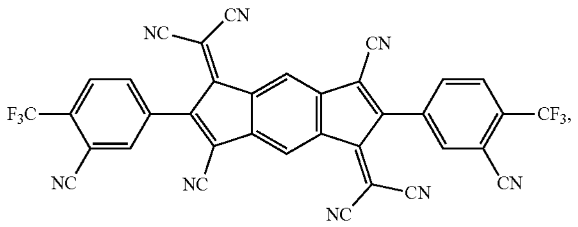
PD-25
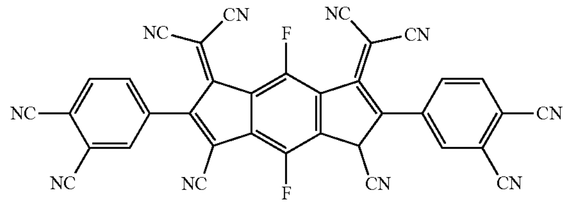
PD-26
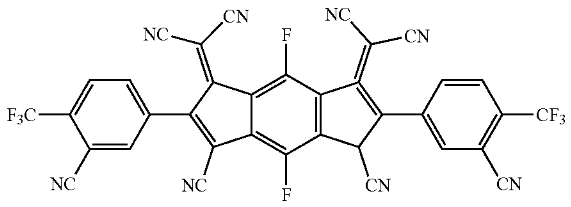
PD-27
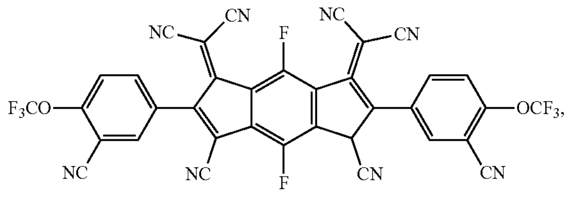

-continued

PD-28

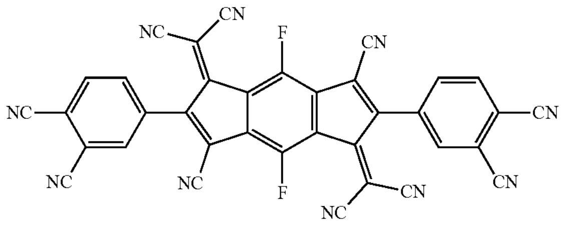

PD-29

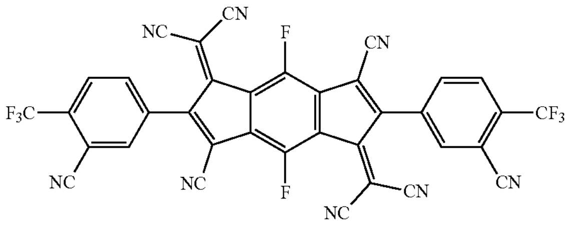

PD-30

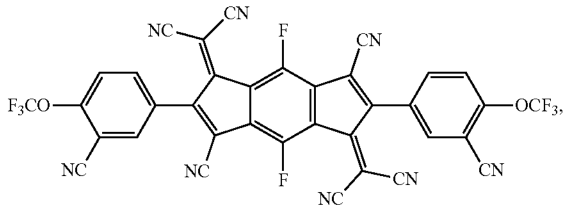

PD-31

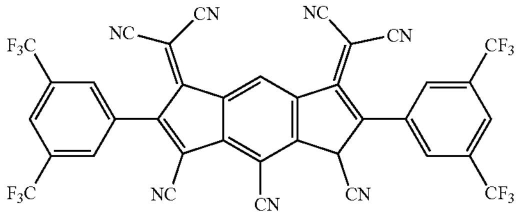

PD-32

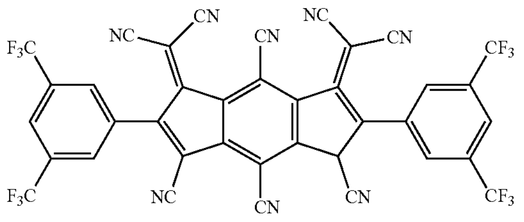

PD-33

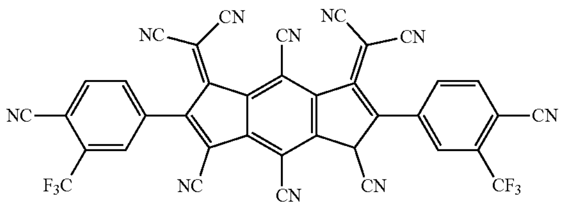

-continued

PD-34

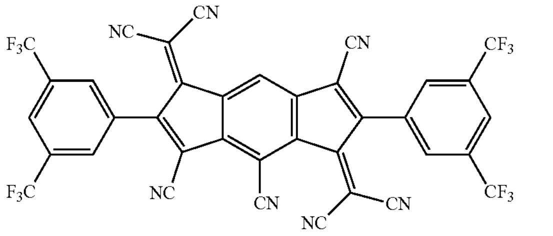

PD-35

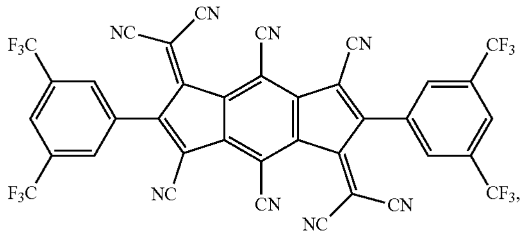

and

PD-36

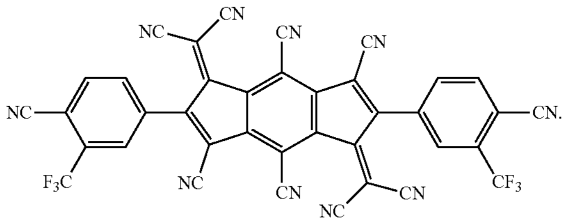

4. The light emitting device according to claim 1, wherein the hole generation layer includes the organic dopant in an amount of 1 wt % to 30 wt %, and the electron generation layer includes the metal dopant in an amount of 0.1 wt % to 5 wt %.

5. The light emitting device according to claim 4, wherein the metal dopant is Yb.

6. The light emitting device according to claim 1, wherein the first host does not comprise phenanthroline.

7. The light emitting device according to claim 1, wherein the second host is an amine-based compound different from a compound of a hole transport layer of an adjacent stack.

8. The light emitting device according to claim 1, wherein the electron generation layer contacts an organic layer of an adjacent stack including a compound which comprises an anthracene group.

9. A light emitting display device comprising:

a substrate including a plurality of subpixels;

a thin film transistor provided at each of the subpixels on the substrate; and the light emitting device according to claim 1, wherein the light emitting device is electrically connected to the thin film transistor.

10. A light emitting device comprising:

a first electrode and a second electrode;

a plurality of stacks between the first electrode and the second electrode; and a charge generation layer between two stacks, the charge generation layer comprising an electron generation layer and a hole generation layer, wherein the electron generation layer comprises a first host and a metal dopant, wherein the hole generation layer comprises a second host and an organic dopant, and wherein the first host is selected from:
NCH-01
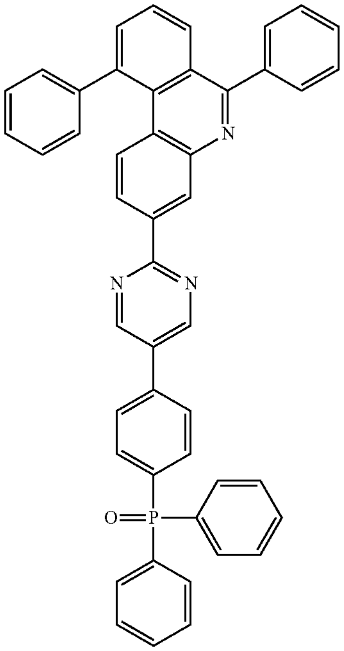
NCH-02
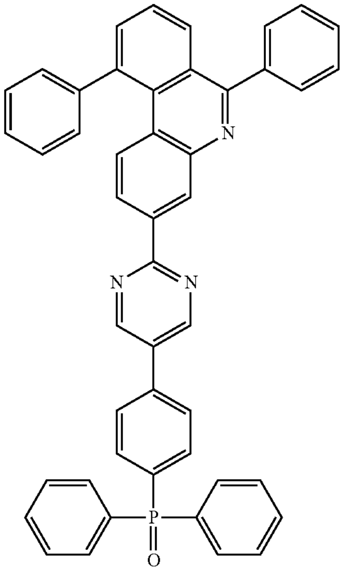
-continued
NCH-03
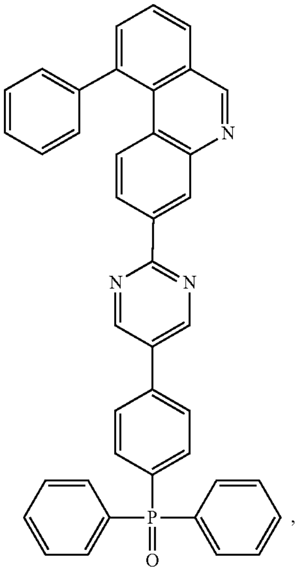
,
NCH-04
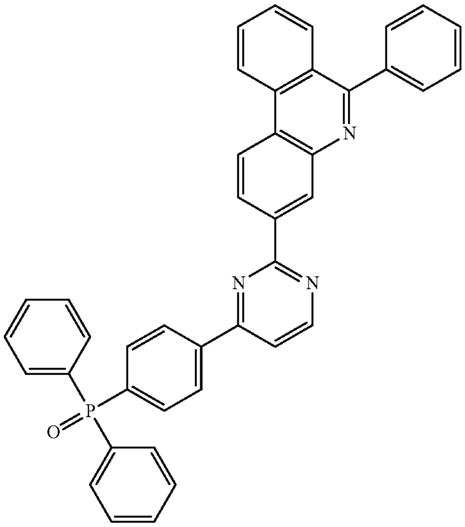
NCH-05
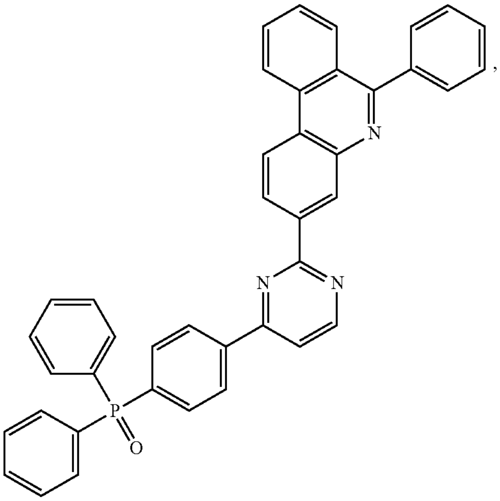
, -continued
NCH-06
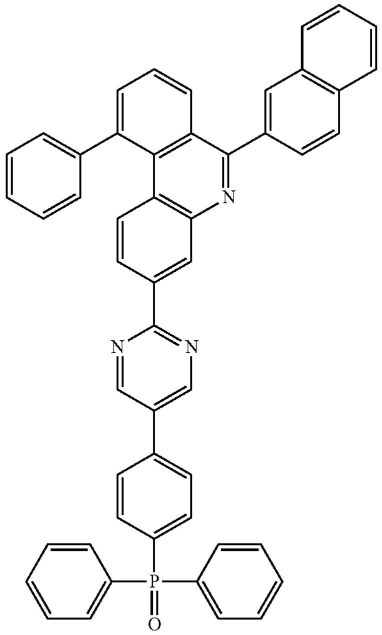
-continued
NCH-08
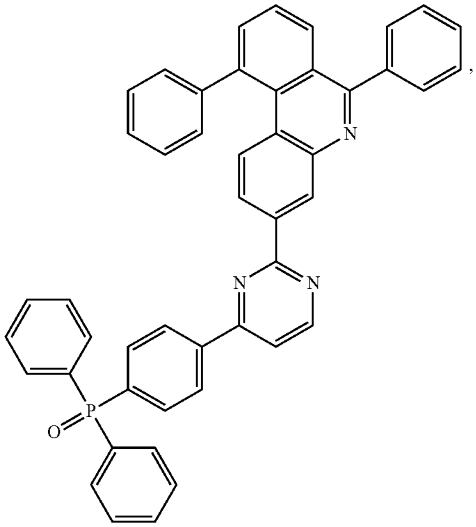
,
NCH-07
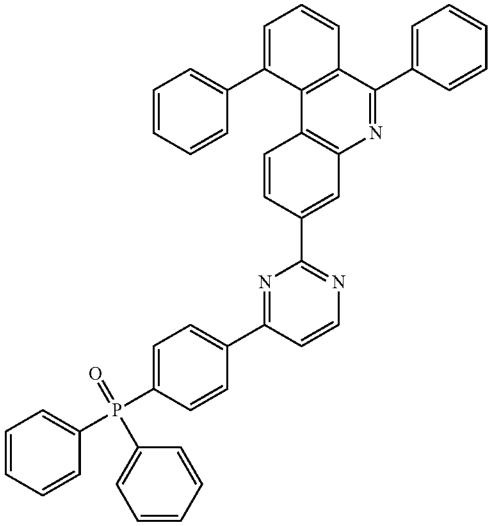
NCH-09
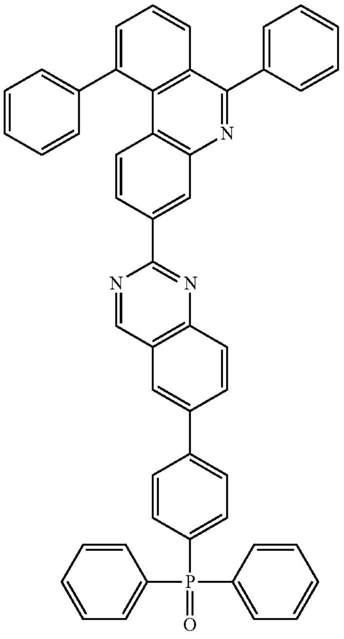

-continued
NCH-10
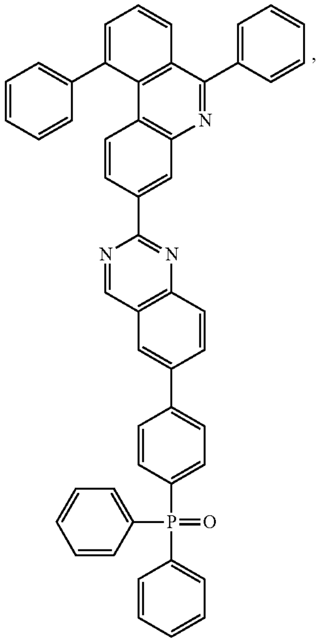,
NCH-11
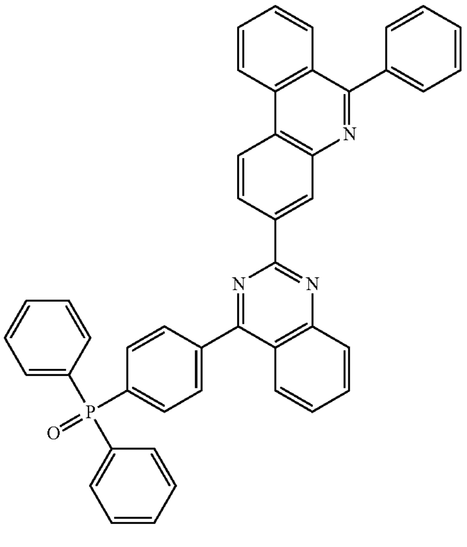
-continued
NCH-12
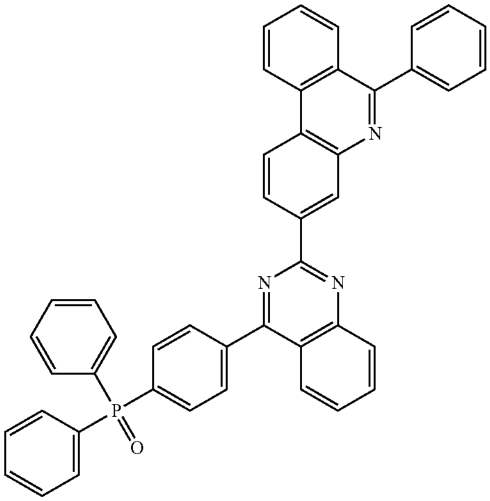
NCH-13
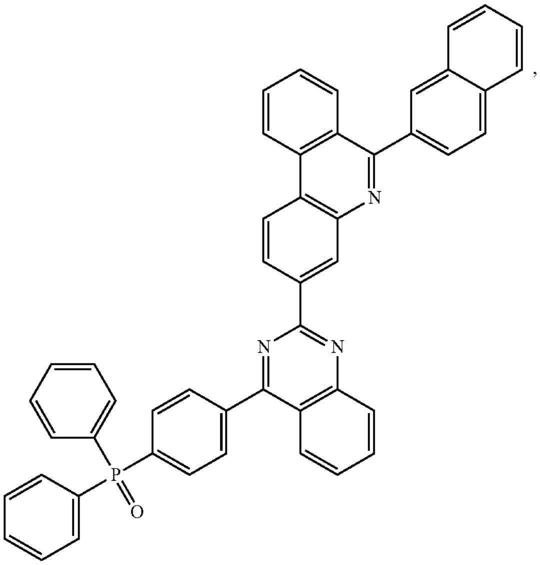,
NCH-14
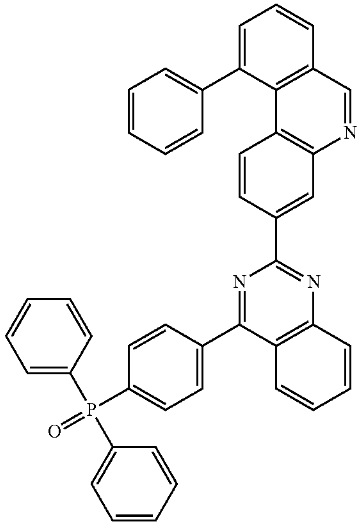

-continued
NCH-15
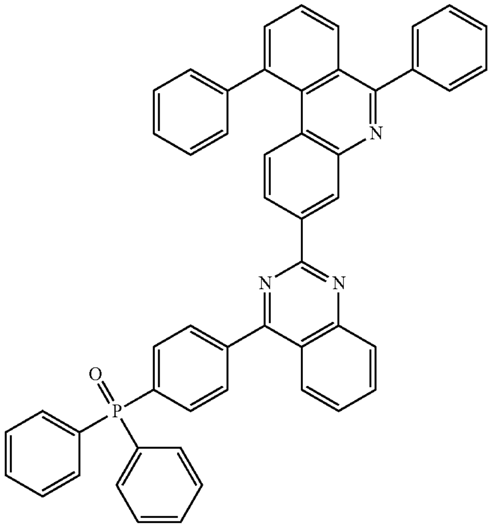
,
NCH-16
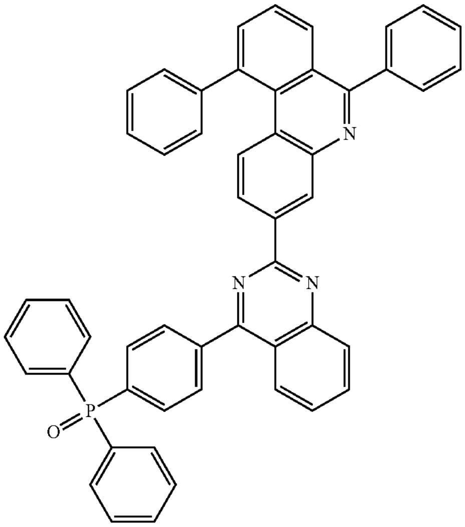
NCH-17
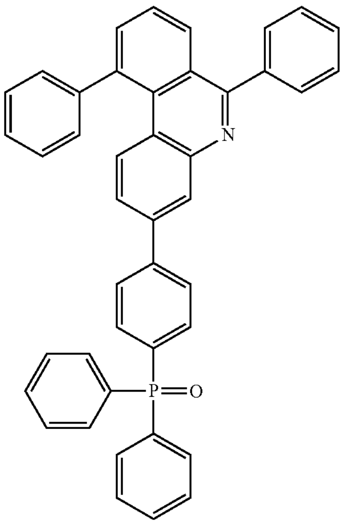
-continued
NCH-18
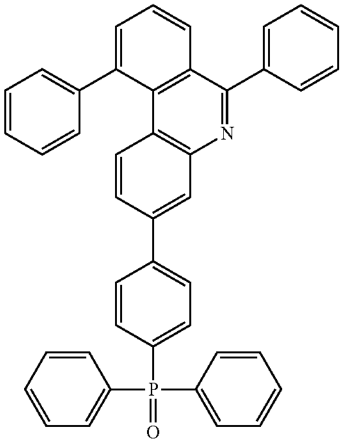
,
NCH-19
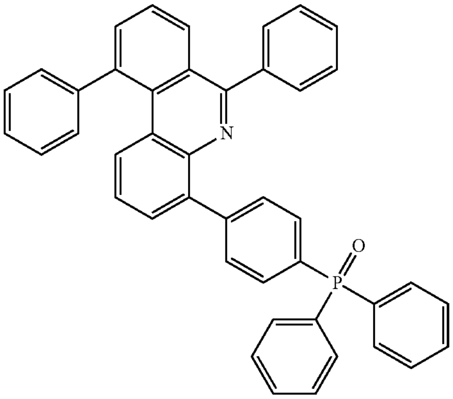
,
NCH-20
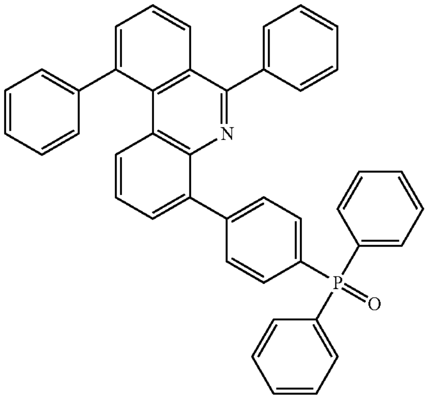
, -continued
NCH-21
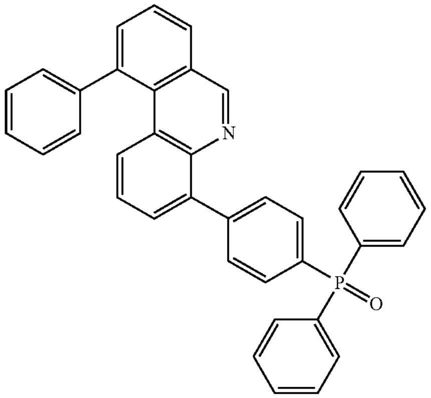
NCH-22
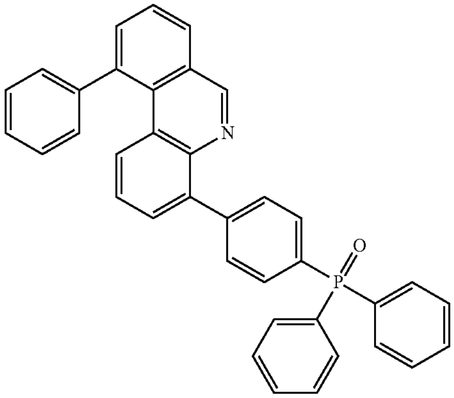
NCH-23
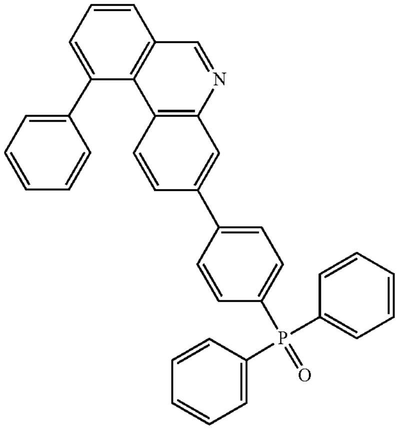
-continued
NCH-24
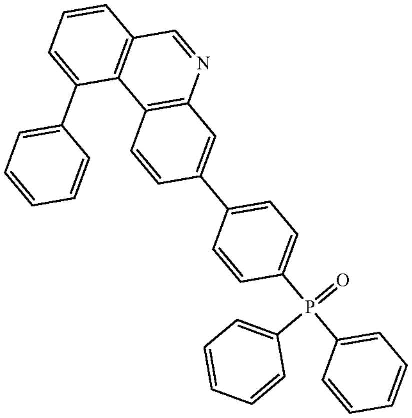
NCH-25
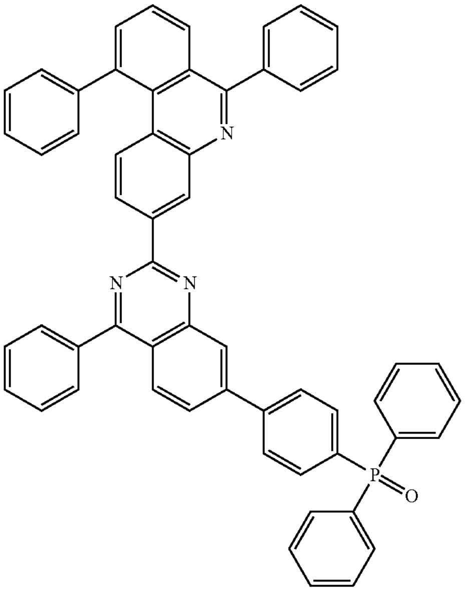
, and
NCH-26
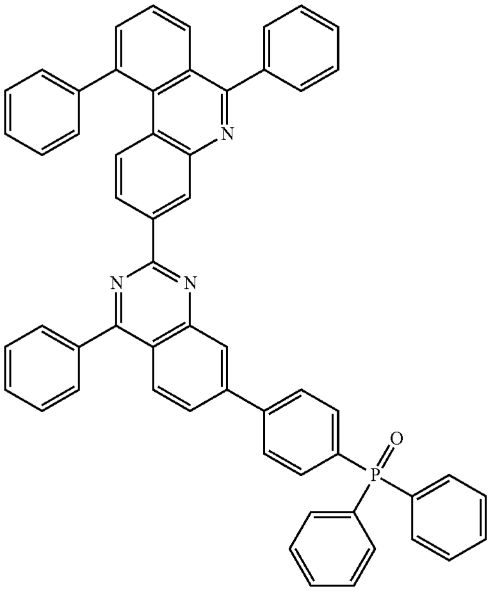
.

11. A light emitting device comprising:

a first electrode and a second electrode;

a blue stack disposed adjacent to the first electrode, the blue stack including a first hole transport layer, a blue light emitting layer, and a first electron transport layer;

a phosphorescent stack disposed adjacent to the second electrode, the phosphorescent stack comprising a second hole transport layer, a phosphorescent light emitting portion comprising at least two light emitting layers configured to emit light with wavelengths longer than blue light, and a second electron transport layer; and a charge generation layer comprising an electron generation layer and a hole generation layer between the blue stack and the phosphorescent stack, wherein the electron generation layer comprises a first host of Formula 1, and

[Formula 1]

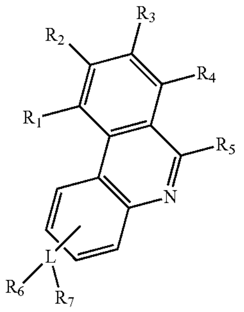

wherein $R_1$ to $R_6$ are selected from a cycloalkyl group, an aryl group, and a heteroaryl group;

$R_7$ is triphenylphosphine oxide; and

L is selected from quinazoline and pyrimidine, wherein the hole generation layer comprises an organic dopant of Formula 2,

[Formula 2]

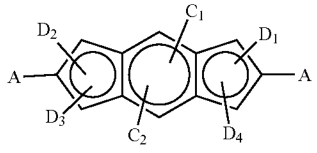

wherein A is selected from hydrogen, deuterium, a halogen group, a cyano group, a malononitrile group, a trifluoromethyl group, a trifluoromethoxy group, a substituted or unsubstituted aryl or heteroaryl group, a substituted or unsubstituted C1-C12 alkyl group, and a substituted or unsubstituted C1-C12 alkoxy group, and the substituent of each of the substituted heteroaryl group, the substituted C1-C12 alkyl group and the substituted C1-C12 alkoxy group is independently one of a halogen group, a cyano group, a malononitrile group, a trifluoromethyl group and a trifluoromethoxy group;

$C_1$ and $C_2$ are each independently one of hydrogen, deuterium, halogen, or a cyano group; and $D_1$ to $D_4$ are each independently connected by a single or double bond, and are substituted with one of halogen, a cyano group, malononitrile, trifluoromethyl, and trifluoromethoxy, and at least two thereof include a cyano group.

12. The light emitting device according to claim 11, wherein the hole generation layer includes the organic dopant in an amount of 1 wt % to 30 wt %, and the electron generation layer includes the first host doped with a metal.

13. The light emitting device according to claim 11, wherein the first host does not comprise phenanthroline.

14. The light emitting device according to claim 11, wherein the organic dopant in the hole generation layer is included in an amine-based second host, and an amount of the second host in the hole generation layer is greater than an amount of the organic dopant in the hole generation layer.

15. The light emitting device according to claim 11, wherein the electron generation layer contacts the first electron transport layer, and the hole generation layer contacts the second hole transport layer.

16. The light emitting device according to claim 15, wherein the first electron transport layer contacts the blue light emitting layer, wherein the at least two light emitting layers further comprise a red light emitting layer, and the second hole transport layer contacts the red light emitting layer.

17. The light emitting device according to claim 11, wherein the electron generation layer further includes a metal dopant selected from Yb, Li, or Mg.

18. The light emitting device according to claim 11, wherein the second host is selected from

PD-04

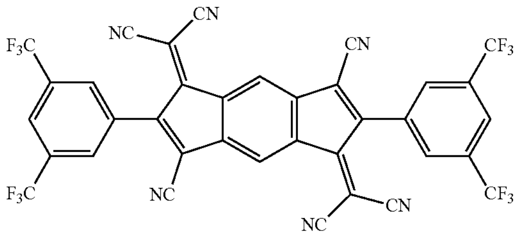

PD-05

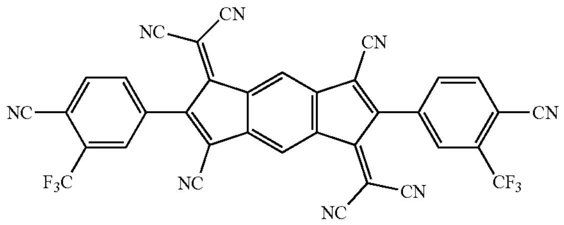

PD-06

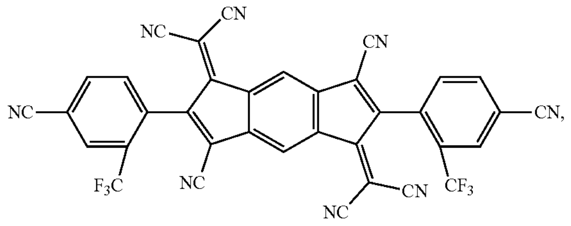

-continued
PD-07
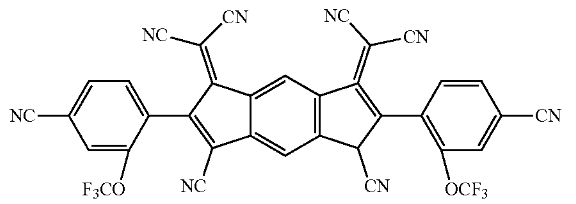
PD-08
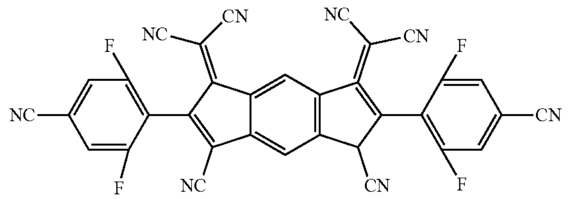
PD-09
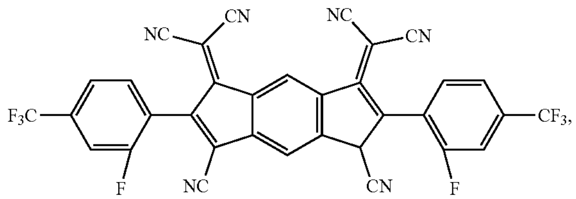
,
PD-10
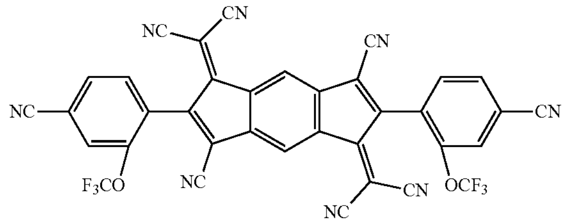
PD-11
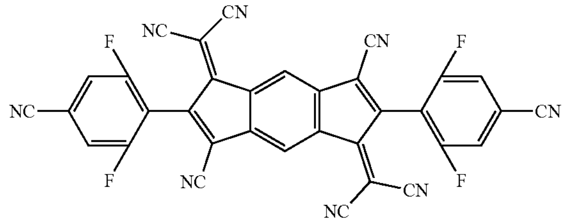
PD-12
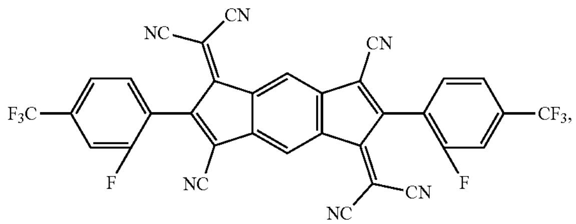
,
-continued
PD-13
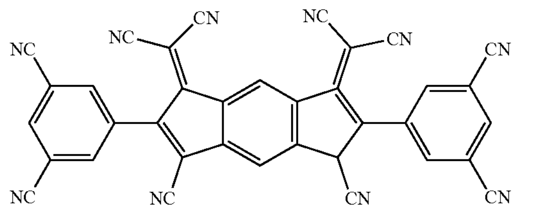
PD-14
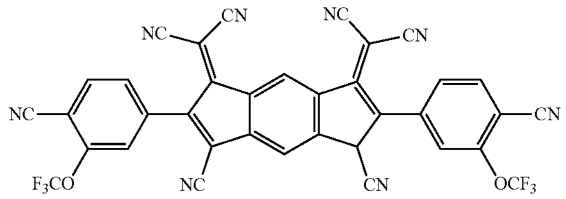
PD-15
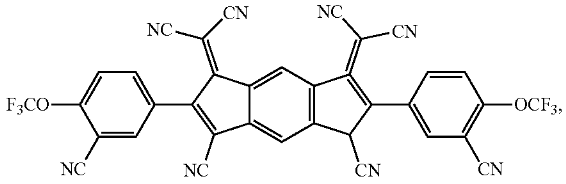
,
PD-16
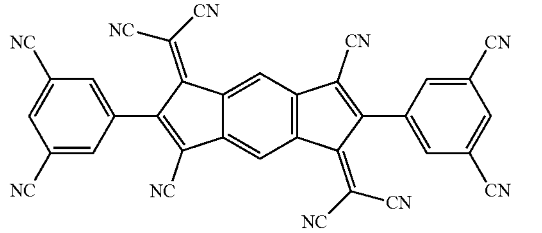
PD-17
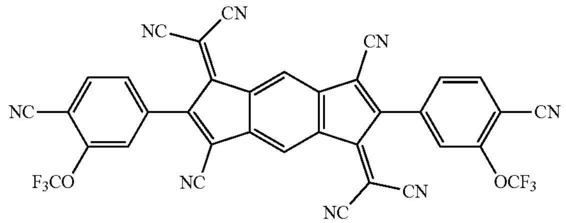
PD-18
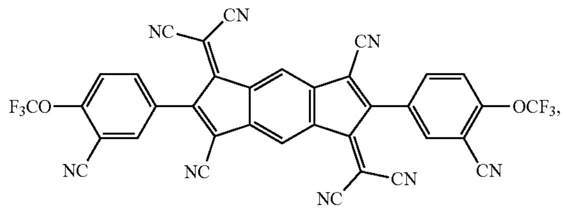
,
PD-19
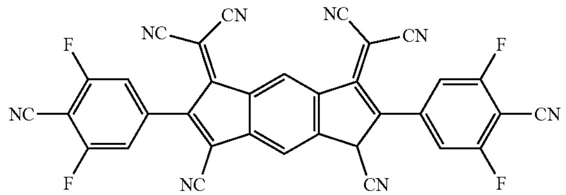

-continued
PD-20
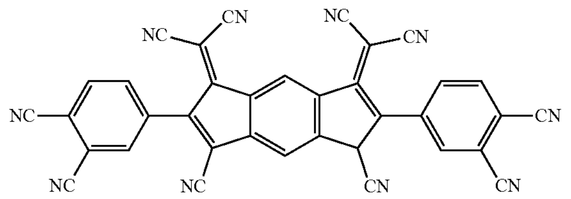
PD-21
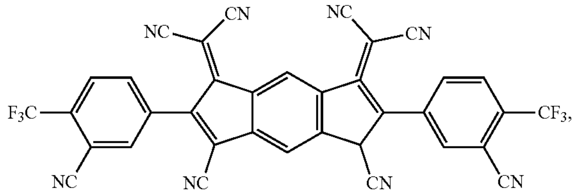
PD-22
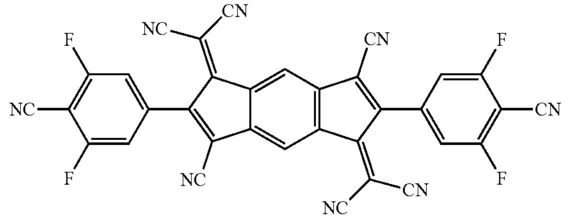
PD-23
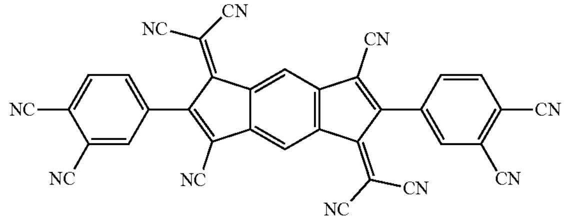
PD-24
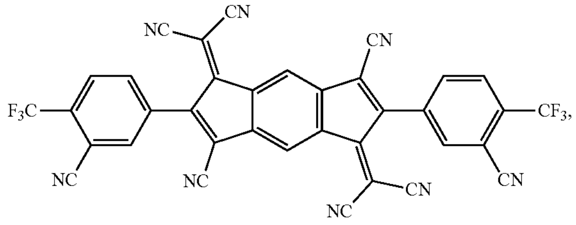
PD-25
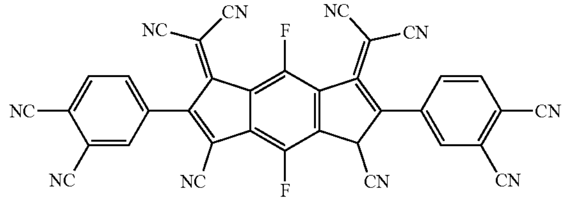
-continued
PD-26
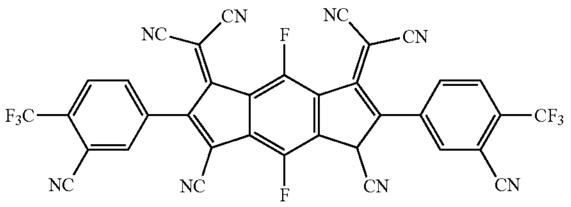
PD-27
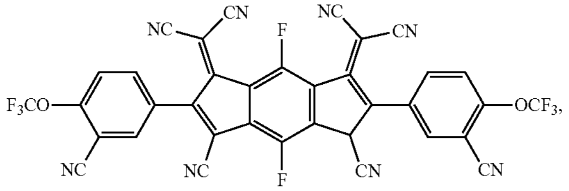
PD-28
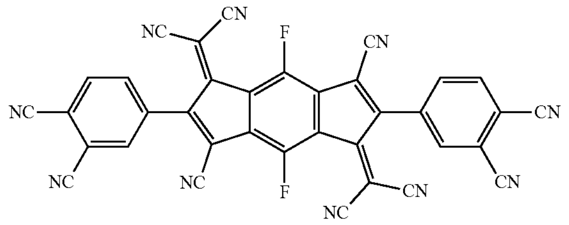
PD-29
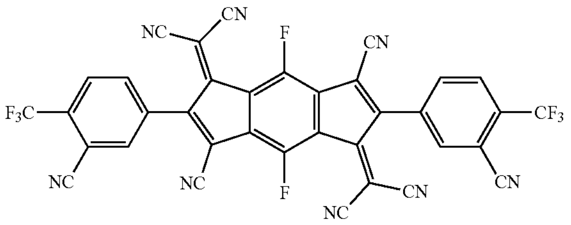
PD-30
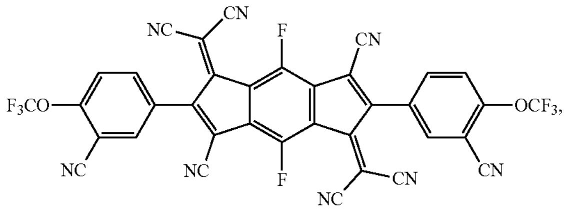
PD-31
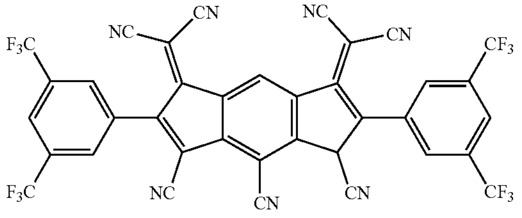

-continued
PD-32
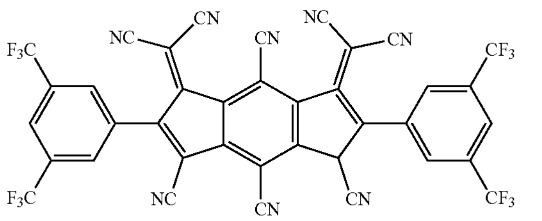
PD-33
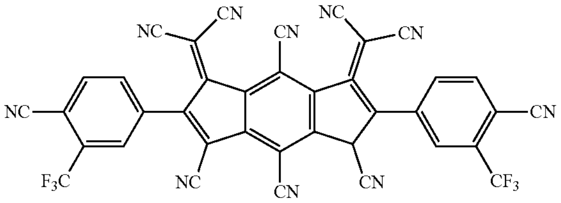
PD-34
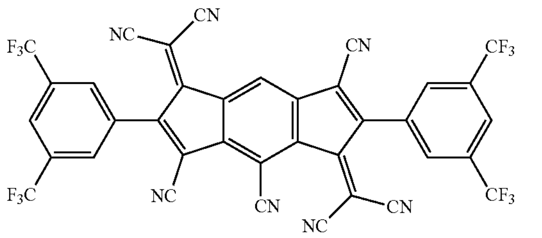
-continued
PD-35
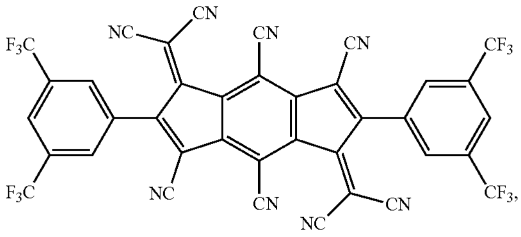
and
PD-36
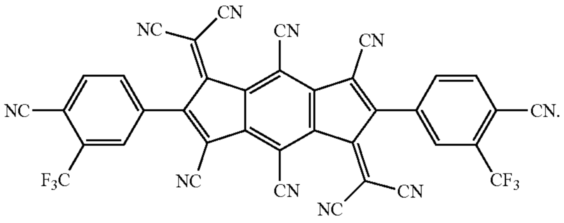
* * * * *